*(12)* United States Patent
Ikeda

(10) Patent No.: US 10,879,282 B2
(45) Date of Patent: Dec. 29, 2020

(54) IMAGING SENSOR, IMAGING SYSTEM, AND MOVING BODY

(71) Applicant: CANON KABUSHIKI KAISHA, Tokyo (JP)

(72) Inventor: Yasuji Ikeda, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 11 days.

(21) Appl. No.: 16/005,525

(22) Filed: Jun. 11, 2018

(65) Prior Publication Data

US 2019/0006403 A1    Jan. 3, 2019

(30) Foreign Application Priority Data

Jun. 29, 2017  (JP) ................. 2017-127980

(51) Int. Cl.
*H01L 27/146*    (2006.01)
*H04N 5/374*    (2011.01)
*H04N 5/378*    (2011.01)
*H04N 5/3745*    (2011.01)
(Continued)

(52) U.S. Cl.
CPC .. *H01L 27/14607* (2013.01); *H01L 27/14623* (2013.01); *H01L 27/14634* (2013.01); *H01L 27/14636* (2013.01); *H01L 27/14643* (2013.01); *H04N 5/374* (2013.01); *H04N 5/378* (2013.01); *H04N 5/379* (2018.08);
(Continued)

(58) Field of Classification Search
CPC .......... G05D 1/0246; G05D 2201/0213; H01L 27/14607; H01L 27/14623; H01L 27/14634; H01L 27/14636; H01L 27/14643; H04N 5/374; H04N 5/37452; H04N 5/37457; H04N 5/378; H04N 5/379
See application file for complete search history.

(56) References Cited

U.S. PATENT DOCUMENTS

2006/0175647 A1 * 8/2006 Felber ................. H01L 22/34
257/296
2007/0132062 A1 * 6/2007 Banerjee ............. H01L 27/0805
257/532
(Continued)

FOREIGN PATENT DOCUMENTS

JP    2004-056048 A    2/2004

*Primary Examiner* — Amy R Hsu
(74) *Attorney, Agent, or Firm* — Canon U.S.A., Inc. IP Division

(57) ABSTRACT

An imaging sensor according to an exemplary embodiment includes a first semiconductor substrate, a second semiconductor substrate, a plurality of pixels, each pixel including a photoelectric conversion unit arranged on the first semiconductor substrate, a plurality of transfer units arranged on the first semiconductor substrate and configured to transfer charges generated in the photoelectric conversion unit or signals based on the charges via a plurality of mutually parallel paths respectively, and a plurality of signal holding units connected to the plurality of transfer units respectively, and a plurality of lines that are arranged between the first semiconductor substrate and the second semiconductor substrate, each of the plurality of lines connecting a corresponding one of the plurality of transfer units to a corresponding one of the plurality of signal holding units in one pixel.

25 Claims, 20 Drawing Sheets

(51) Int. Cl.
*H04N 5/369* (2011.01)
*G05D 1/02* (2020.01)

(52) U.S. Cl.
CPC ..... *H04N 5/37452* (2013.01); *H04N 5/37457* (2013.01); *G05D 1/0246* (2013.01); *G05D 2201/0213* (2013.01)

(56) References Cited

U.S. PATENT DOCUMENTS

| | | | |
|---|---|---|---|
| 2010/0245647 A1* | 9/2010 | Honda | H01L 27/14636 |
| | | | 348/308 |
| 2017/0134675 A1* | 5/2017 | Hynecek | H04N 5/37452 |
| 2017/0162618 A1* | 6/2017 | Ooki | H01L 25/0657 |
| 2017/0221950 A1* | 8/2017 | Ho | H01L 27/1469 |
| 2017/0278214 A1* | 9/2017 | Terashima | G06T 1/20 |
| 2018/0302579 A1* | 10/2018 | Manabe | H01L 27/14612 |

\* cited by examiner

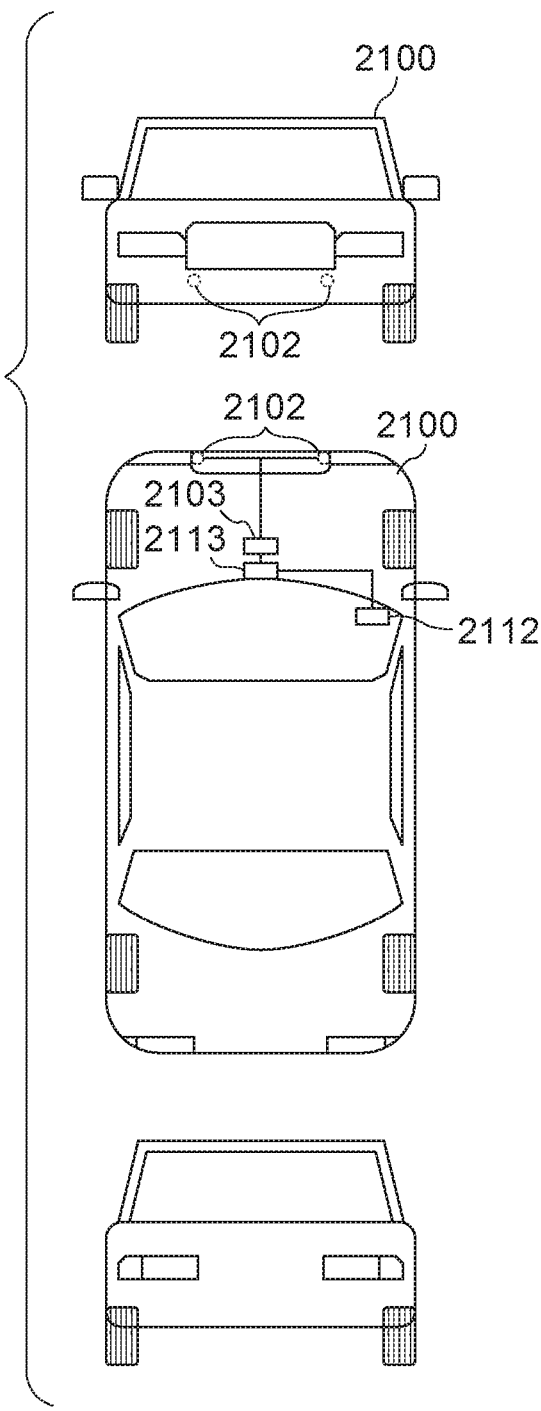

IMAGING SENSOR, IMAGING SYSTEM, AND MOVING BODY

BACKGROUND OF THE INVENTION

Field of the Invention

The aspect of the embodiments relates to an imaging sensor, an imaging system, and a moving body.

Description of the Related Art

In order to achieve multiple applications and/or multi-functions of an imaging sensor, an imaging sensor including a pixel provided with a plurality of signal holding units has been proposed. In an imaging sensor described in Japanese Patent Laid-Open No. 2004-056048 (hereinafter, referred to as Patent Document 1), one pixel is provided with a plurality of floating diffusion portions (FD portions).

SUMMARY OF THE INVENTION

An imaging sensor according to an exemplary embodiment includes a first semiconductor substrate, a second semiconductor substrate, and a plurality of pixels. Each pixel includes a photoelectric conversion unit arranged on the first semiconductor substrate, a plurality of transfer units arranged on the first semiconductor substrate and configured to transfer charges generated in the photoelectric conversion unit or signals based on the charges via a plurality of mutually parallel paths respectively, and a plurality of signal holding units connected to the plurality of transfer units respectively. The imaging sensor includes a plurality of lines that are arranged between the first semiconductor substrate and the second semiconductor substrate, each of the plurality of lines connecting a corresponding one of the plurality of transfer units to a corresponding one of the plurality of signal holding units in one pixel.

An imaging sensor according to another exemplary embodiment includes a first semiconductor substrate, a second semiconductor substrate, and a plurality of pixels. Each of the plurality of pixels includes a photoelectric conversion unit arranged on the first semiconductor substrate, a plurality of transfer units configured to transfer charges generated in the photoelectric conversion unit or signals based on the charges via a plurality of mutually parallel paths respectively, and a plurality of signal holding units arranged on the second semiconductor substrate and connected to the plurality of transfer units respectively.

An imaging sensor according to still another exemplary embodiment includes a semiconductor substrate including an incident surface of light, and a plurality of pixels. Each pixel includes a photoelectric conversion unit arranged on the semiconductor substrate, and a plurality of transfer units connected to the photoelectric conversion unit and configured to transfer charges from the photoelectric conversion unit via a plurality of mutually parallel signal paths respectively, and a plurality of signal holding units connected to the plurality of transfer units respectively. Each of the plurality of transfer units includes a transfer gate electrode that transfers the charges in a direction intersecting with the incident surface.

Further features of the disclosure will become apparent from the following description of exemplary embodiments with reference to the attached drawings.

BRIEF DESCRIPTION OF THE DRAWINGS

FIGS. 20A and 20B are block diagrams of a moving body according to an exemplary embodiment.

DESCRIPTION OF THE EMBODIMENTS

In a case where a photoelectric conversion unit and a plurality of signal holding units included one pixel are arranged on a single semiconductor substrate, the area occupied by the plurality of signal holding units may be increased. There is a possibility that the area occupied by the photoelectric conversion unit may be relatively decreased. As a result, there is a possibility that sensitivity may be decreased. According to some of exemplary embodiments of the present disclosure, the sensitivity of the imaging sensor can be improved.

First Exemplary Embodiment

Overall Block Diagram

Figure 1:
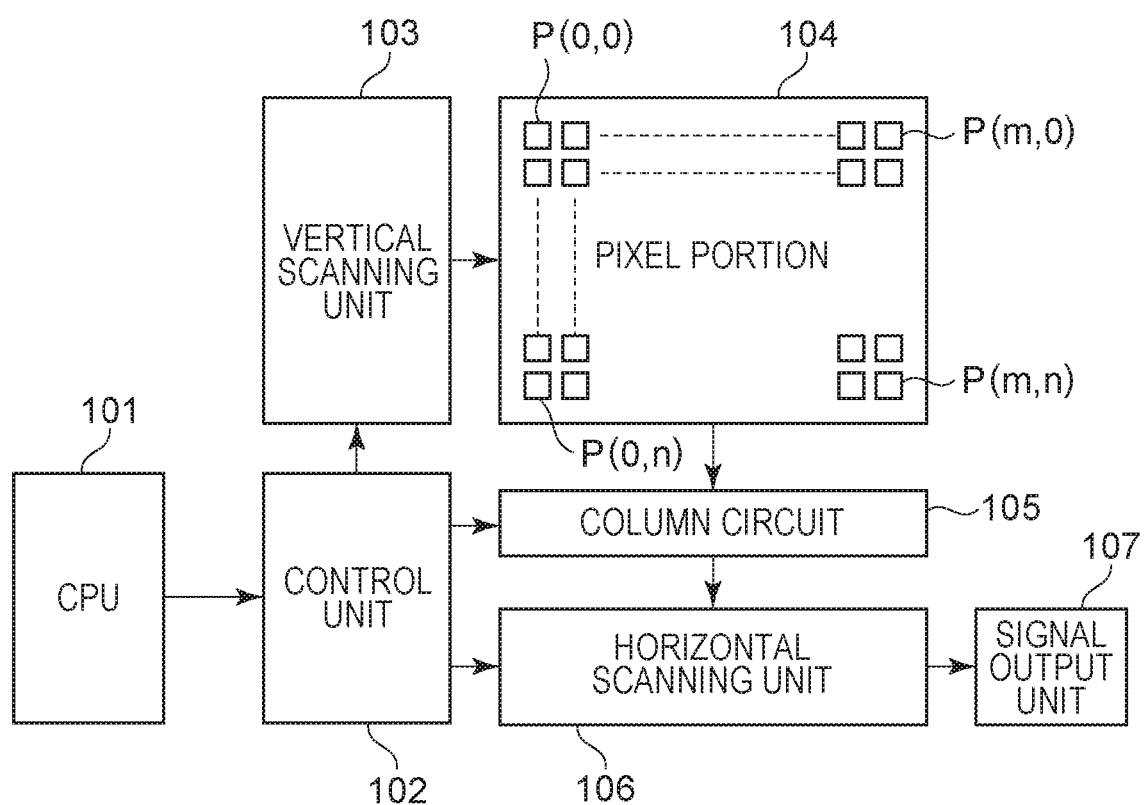
FIG. 1 is a block diagram schematically illustrating a configuration example of an imaging sensor.

FIG. 1 is a block diagram schematically illustrating a configuration example of an imaging sensor according to the present exemplary embodiment. The imaging sensor includes a CPU 101, a control unit 102, a vertical scanning unit 103, a pixel portion 104, a column circuit 105, a horizontal scanning unit 106, and a signal output unit 107. The CPU 101 controls the entirety of the sensor. The control unit 102 receives a synchronous signal from the CPU 101 and controls the respective units of the imaging sensor. The vertical scanning unit 103 receives a control signal of the control unit 102 and operates. The pixel portion 104 is constituted by a plurality of pixels arranged so as to form a matrix including a plurality of rows and a plurality of columns. The column circuit 105 processes the signal from the pixel portion 104. The horizontal scanning unit 106 sequentially reads out signals from the column circuit 105 to the signal output unit 107. The column circuit 105 and the horizontal scanning unit 106 operate in response to the control signals of the control unit 102. In FIG. 1, reference signs P (x, y) are assigned to the respective pixels. Herein, x and y in the reference sign respectively indicate a column number and a row number of the pixel.

The imaging sensor is provided with a first substrate and a second substrate. Each of the first substrate and the second substrate is a semiconductor substrate formed of a semiconductor material such as silicon. Elements constituting the respective blocks illustrated in FIG. 1 are arranged on the first substrate or the second substrate.

Pixel Circuit 1

Figure 2:
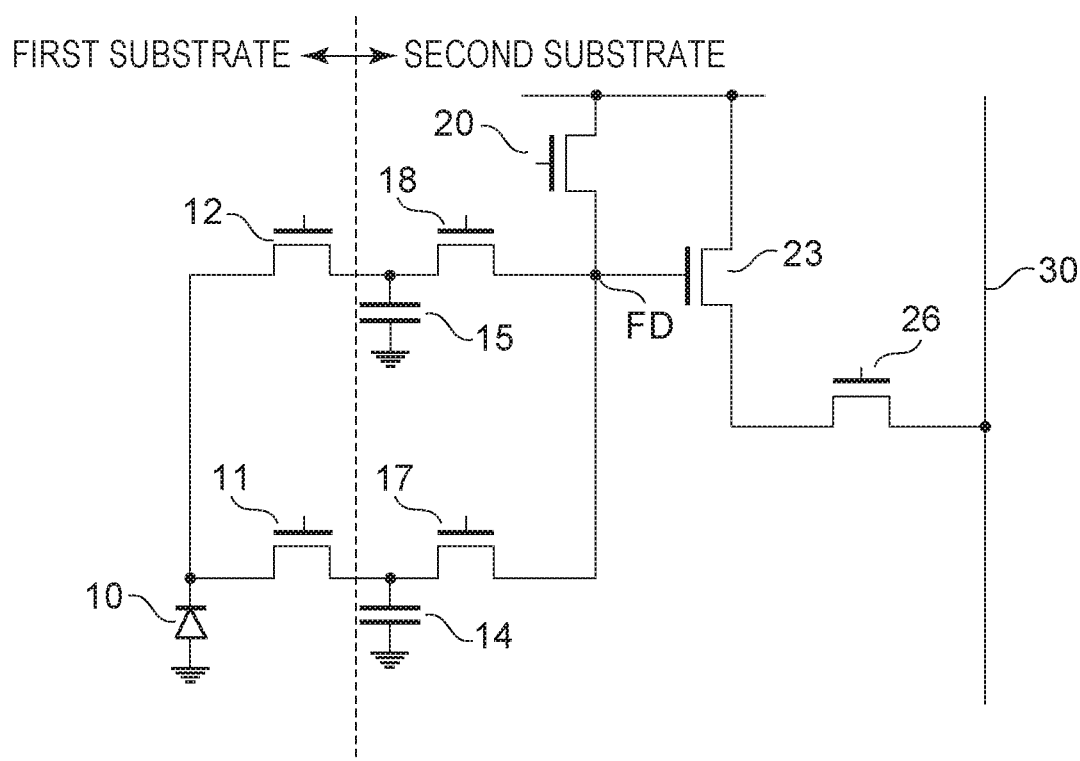
FIG. 2 illustrates an equivalent circuit of a pixel of the imaging sensor.

FIG. 2 illustrates an equivalent circuit of the pixel P of the imaging sensor. The pixel P includes a photoelectric conversion unit 10. The photoelectric conversion unit 10 generates charges in accordance with incident light. The photoelectric conversion unit 10 is a photodiode, for example. The pixel P includes a transfer transistor 11, a transfer transistor 12, a signal holding unit 14, a signal holding unit 15, a floating diffusion portion (hereinafter, referred to as an FD portion), a reset transistor 20, an amplification transistor 23, and a selection transistor 26.

Both the transfer transistors 11 and 12 are connected to the photoelectric conversion unit 10. The transfer transistor 11 transfers charges generated in the photoelectric conversion unit 10 from the photoelectric conversion unit 10 to the signal holding unit 14. The transfer transistor 12 transfers the charges generated in the photoelectric conversion unit 10 from the photoelectric conversion unit 10 to the signal holding unit 15. With the above-described configuration, the two transfer transistors 11 and 12 form two paths which are parallel to each other. That is, both the two transfer transistors 11 and 12 are a transfer unit that transfers the charges of the photoelectric conversion unit 10. A path for the transfer of the charges is a channel of the transistor, for example.

The pixel P includes second transfer transistors 17 and 18. The second transfer transistor 17 transfers the signal of the signal holding unit 14 to the FD portion. The second transfer transistor 18 transfers the signal of the signal holding unit 15 to the FD portion. The second transfer transistor 17 and the second transfer transistor 18 form two paths which are parallel to each other. On the other hand, the (first) transfer transistor 11 and the second transfer transistor 17 form a serial signal path between the photoelectric conversion unit 10 and the FD portion. Similarly, the transfer transistor 12 and the second transfer transistor 18 form a serial signal path.

The amplification transistor 23 outputs a signal in accordance with a voltage of the FD portion to a signal line 30. The selection transistor 26 connects the amplification transistor 23 and the signal line 30 to each other. When on and off of the selection transistor 26 are switched, it is possible to select one or a plurality of pixels P that output the signal among the plurality of pixels P. The reset transistor 20 resets the voltage of the FD portion to a predetermined value.

In the circuit illustrated in FIG. 2, the two signal holding units 14 and 15 are connected to the common FD portion. For this reason, the number of the amplification transistors 23 can be decreased. As a result, it is possible to reduce the circuit scale.

The photoelectric conversion unit 10 and the transfer transistors 11 and 12 of the pixel P are arranged on the first substrate. The signal holding units 14 and 15 and the second transfer transistors 17 and 18 of the pixel P are arranged on the second substrate. In addition, the reset transistor 20, the amplification transistor 23, and the selection transistor 26 of the pixel P are arranged on the second substrate.

Planar Structure 1

Figure 3:
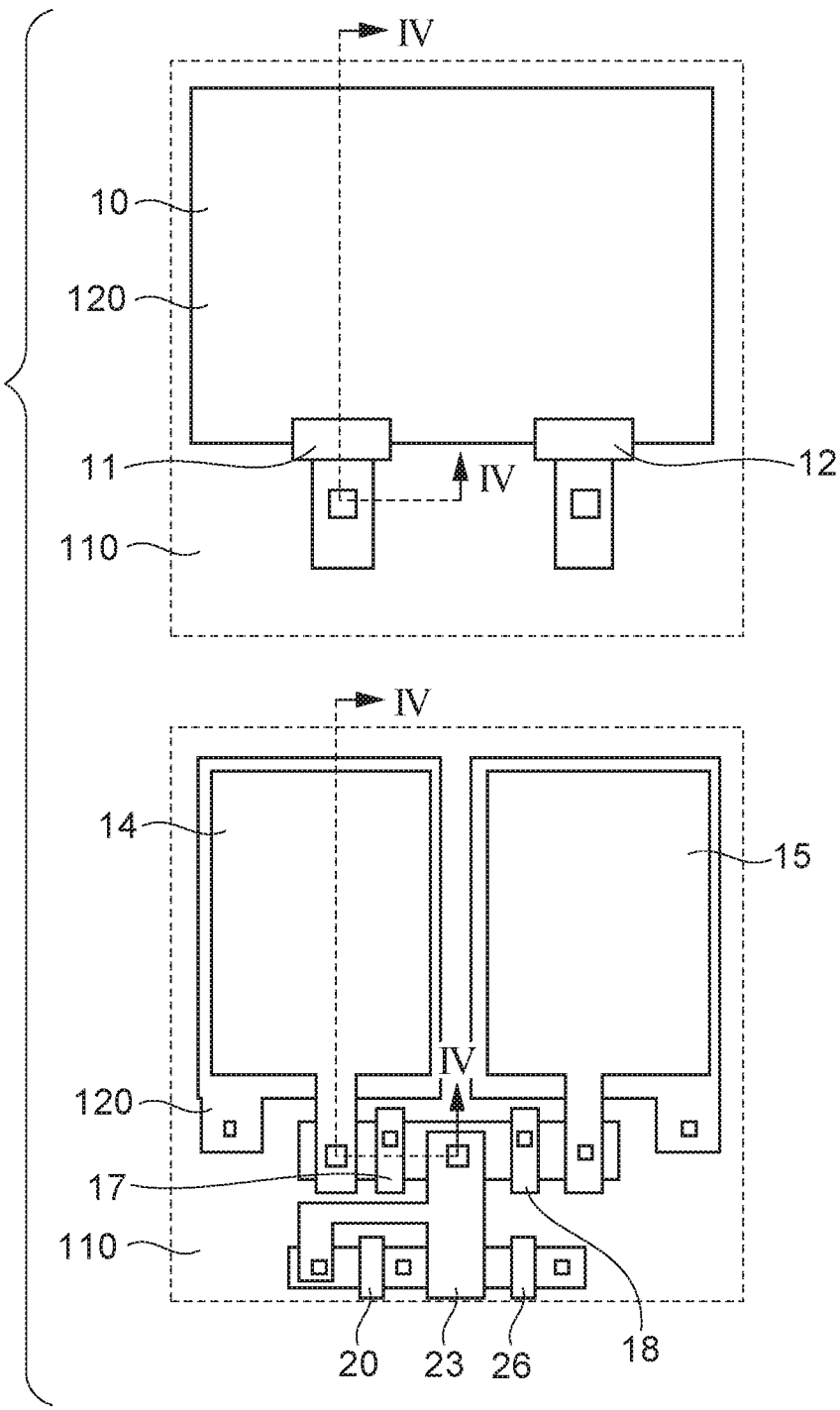
FIG. 3 schematically illustrates a planar structure of the pixel of the imaging sensor.

FIG. 3 schematically illustrates a planar structure of the pixel P. A section arranged on the first substrate of the pixel P is illustrated on an upper side of FIG. 3. A section arranged on the second substrate of the pixel P is illustrated on a lower side of FIG. 3.

An element isolation region 110 such as STI or LOCOS defines an active region 120 of the first substrate. A semiconductor region constituting the photoelectric conversion unit 10 (hereinafter, simply referred to as the photoelectric conversion unit 10) and semiconductor regions connected to the signal holding units 14 and 15 are arranged in the active region 120. In a plan view with respect to a surface of the first substrate, a gate electrode of the transfer transistor 11 is arranged between the photoelectric conversion unit 10 and the semiconductor region connected to the signal holding unit 14. A gate electrode of the transfer transistor 12 is arranged between the photoelectric conversion unit 10 and the semiconductor region connected to the signal holding unit 15.

The element isolation region 110 defines the active region 120 of the second substrate. A plurality of active regions 120 are arranged with respect to the single pixel P on the second substrate. Both of the signal holding units 14 and 15 include an electrode formed of polysilicon and a semiconductor region arranged in the active region 120. That is, the signal holding units 14 and 15 are an MIS capacitance. A ground potential is supplied to the semiconductor regions of the signal holding units 14 and 15. The polysilicon electrodes of the signal holding units 14 and 15 are respectively connected to the semiconductor regions of the first substrate. In addition, the polysilicon electrodes of the signal holding units 14 and 15 are respectively connected to the second transfer transistors 17 and 18.

As illustrated in FIG. 3, the second transfer transistors 17 and 18, the reset transistor 20, the amplification transistor 23, and the selection transistor 26 are arranged in the active region 120 of the second substrate. In FIG. 3, reference signs are assigned to the gate electrodes of the respective transistors. The two semiconductor regions on both sides of the gate electrode constitute a source and a drain. A region arranged between a gate electrode of the second transfer transistor 17 and the second transfer transistor 18 is a semiconductor region constituting the FD portion. The FD portion includes the above-described semiconductor region, a gate electrode of the amplification transistor 23, and a source region of the reset transistor 20. The semiconductor region between a gate electrode of the reset transistor 20 and the gate electrode of the amplification transistor 23 constitutes a drain of the reset transistor 20 and a drain of the amplification transistor 23. A power source voltage is supplied to a drain of the reset transistor 20 and the drain of the amplification transistor 23. A source of the selection transistor 26 is connected to the signal line 30.

Section Structure 1

Figure 4:
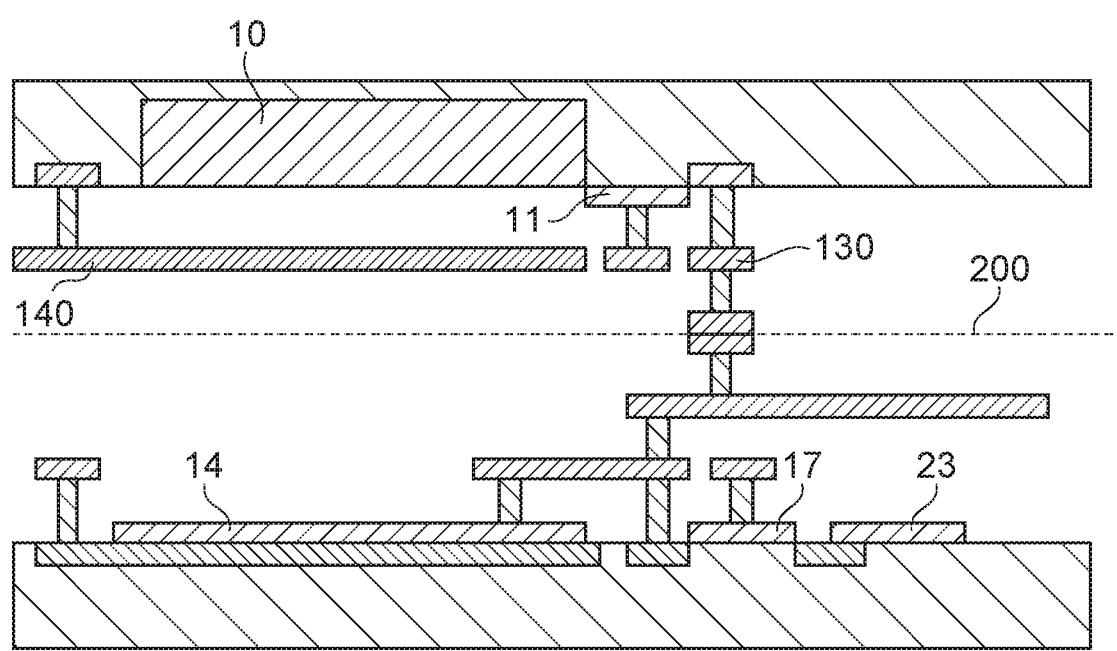
FIG. 4 schematically illustrates a section structure of the pixel of the imaging sensor.

FIG. 4 schematically illustrates a section structure of the pixel P. The same part as that in FIG. 3 is assigned with the same reference sign as that in FIG. 3. FIG. 4 schematically illustrates a section along a line IV-IV of FIG. 3.

The transfer transistor 11 arranged on the first substrate and the signal holding unit 14 arranged on the second substrate connected to each other by a line 130 arranged between the two substrates. As illustrated in FIG. 4, the line 130 arranged between the two substrates connects the semiconductor region of the transfer transistor 11, the electrode of the signal holding unit 14 which is formed of polysilicon, and the semiconductor region of the second transfer transistor 17 to one another. The line 130 may also include a bonding portion 200 between lines. The bonding portion 200 between the lines is formed by preparing two semiconductor substrates and bonding the lines arranged on the respective semiconductor substrates to each other.

In FIG. 4, an insulating film which is not illustrated in the drawing is arranged between the electrode of the signal holding unit 14 which is formed of polysilicon and the semiconductor region of the second substrate. An insulating film which is not illustrated in the drawing is also arranged between another gate electrode and the substrate.

A light shielding portion 140 is arranged between the first substrate and the second substrate. The light shielding portion 140 is arranged between the photoelectric conversion unit 10 arranged on the first substrate and the signal holding unit 14 arranged on the second substrate. The light shielding portion 140 shields light that has passed through the first substrate. The light shielding portion 140 is constituted by a metallic member such as aluminum, copper, or tungsten. With the above-described configuration, since the light incidence on the signal holding unit 14 can be avoided, it is possible to reduce the noise. The light shielding portion 140 may also serves as a line that supplies a potential to a well of the first substrate.

It should be noted that, according to the present exemplary embodiment, as illustrated in FIGS. 2 to 4, a part of the pixel P is arranged on the first substrate, and the other part of the pixel P is arranged on the second substrate. Elements constituting blocks except for the pixel portion 104 illustrated in FIG. 1 are arranged on the second substrate.

Pixel Circuit 2

Next, a modified example of the pixel portion 104 according to the present exemplary embodiment will be described. A pixel circuit which will be described below is employed instead of the pixel P of FIG. 2.

Figure 5A:
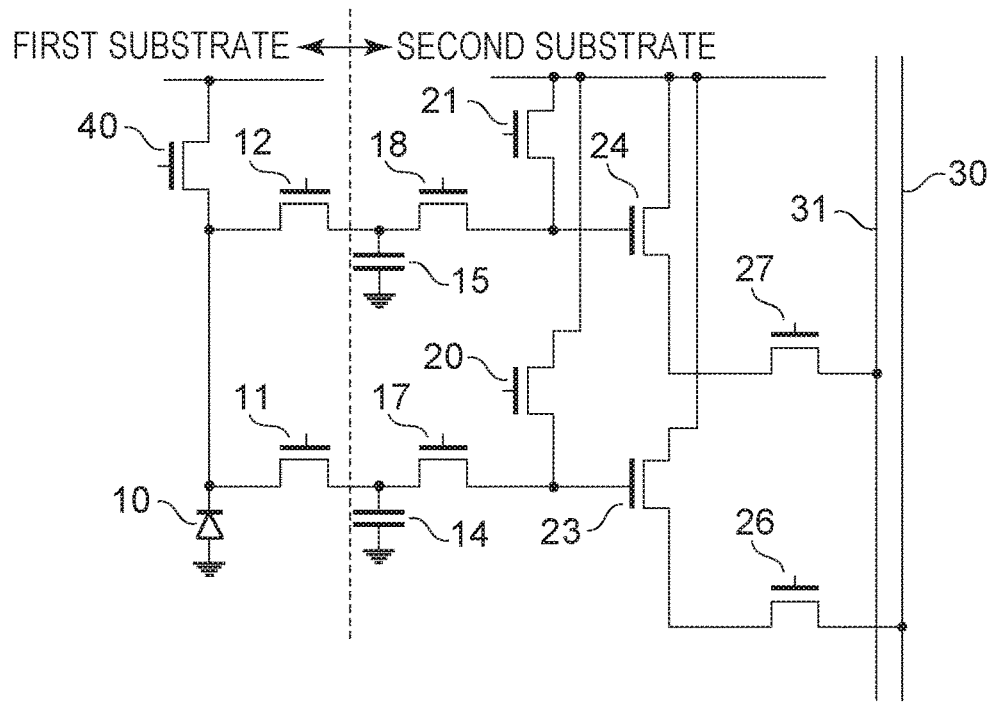
FIGS. 5A and 5B illustrate an equivalent circuit of the pixel of the imaging sensor.

FIG. 5A illustrates an equivalent circuit of the pixel P. The single pixel P includes two amplification transistors 23 and 24. Although different reference signs are assigned for distinguishing the amplification transistors from each other, the two amplification transistors 23 and 24 are provided with the same function. For this reason, the above-described explanation with regard to the amplification transistor 23 also similarly applies to the amplification transistor 24.

The signal holding unit 14 is connected to the amplification transistor 23 via the second transfer transistor 17. On the other hand, the signal holding unit 15 is connected to the amplification transistor 24 via the second transfer transistor 18. The reset transistor 20 is connected to the gate of the amplification transistor 23. A reset transistor 21 is connected to the gate of the amplification transistor 24. The source of the amplification transistor 23 is connected to the signal line 30 via the selection transistor 26. A source of the amplification transistor 24 is connected to a signal line 31 via a selection transistor 27.

The pixel P illustrated in FIG. 5A includes a charge discharging transistor 40. The charge discharging transistor 40 is connected to a path between the photoelectric conversion unit 10 and a power source node. When the charge discharging transistor 40 is turned on, the charges of the photoelectric conversion unit 10 are discharged. According to the above-described configuration, the photoelectric conversion unit 10 can be reset without the intermediation of the signal holding unit. It should be noted that the charge discharging transistor 40 may be provided in the respective circuits of FIG. 2, FIG. 5B, and FIG. 6.

Pixel Circuit 3

Another modified example of the pixel portion 104 according to the present exemplary embodiment will be described. A pixel circuit which will be described below is employed instead of the pixel P of FIG. 2.

Figure 5B:
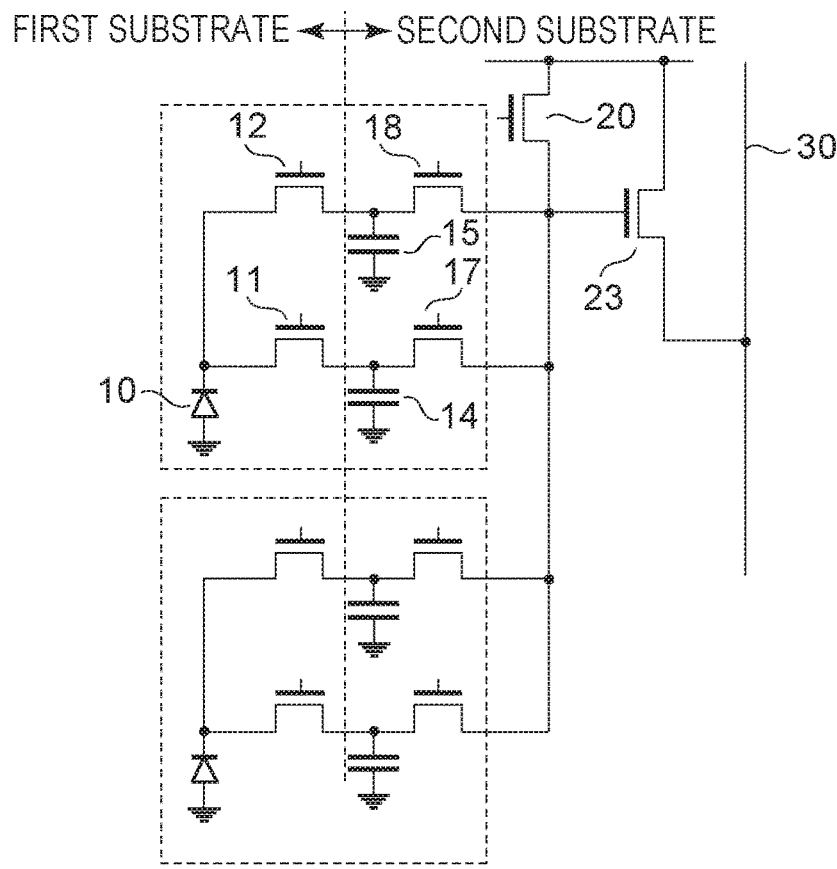

FIG. 5B illustrates an equivalent circuit of the pixel P. The two pixels P share the single amplification transistor 23 and the single reset transistor 20. Although reference signs are omitted, FIG. 5B illustrates the photoelectric conversion unit 10, the transfer transistors 11 and 12, the signal holding units 14 and 15, and the second transfer transistors 17 and 18 included in the two pixels P. Since the functions and connections of the respective element in the two pixels P are the same, detailed descriptions will be omitted. It should be noted that FIG. 5B illustrates the pixel P that does not include the selection transistor. However, the selection transistor may be arranged between the amplification transistor and an output line similarly as in FIG. 2.

According to the circuit configuration of FIG. 5B, it is possible to decrease the number of the amplification transistor 23 and the number of the reset transistor 20 per pixel.

Pixel Circuit 4

Another modified example of the pixel portion 104 according to the present exemplary embodiment will be described. A pixel circuit which will be described below is employed instead of the pixel P of FIG. 2.

Figure 6:
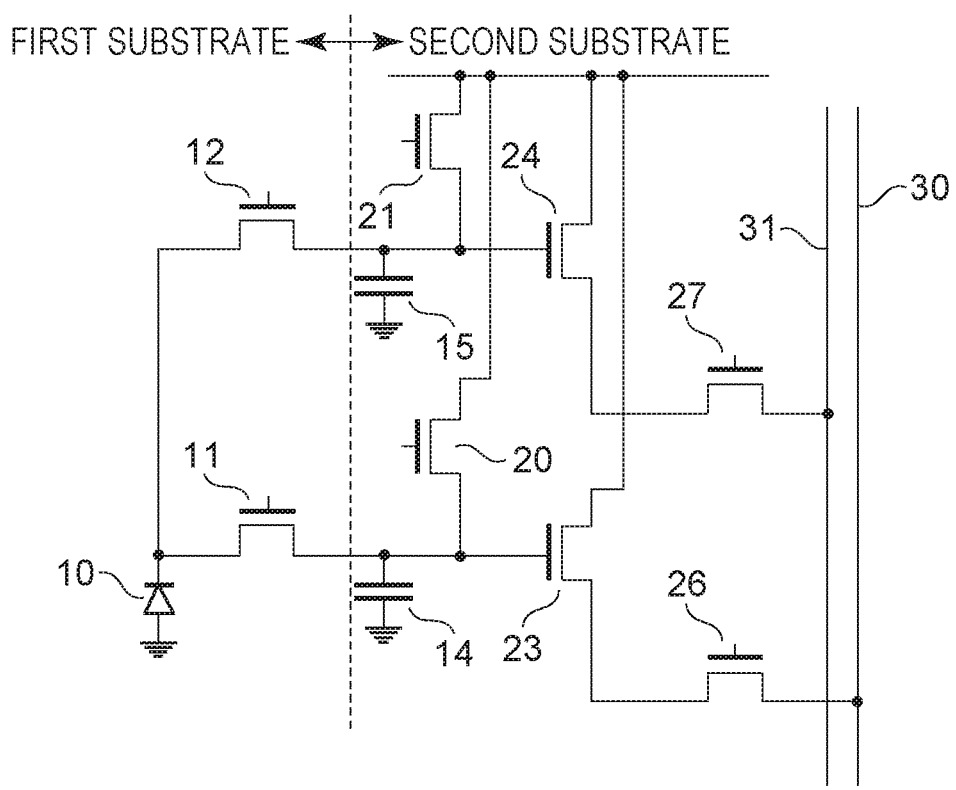
FIG. 6 illustrates an equivalent circuit of the pixel of the imaging sensor.

FIG. 6 illustrates an equivalent circuit of the pixel P. As compared with FIG. 2, the second transfer transistors 17 and 18 are not included in the pixel P. On the other hand, the two amplification transistors 23 and 24 are included in the single pixel P. The signal holding unit 14 is connected to the reset transistor 20 and the amplification transistor 23. That is, the signal holding unit 14 functions as a first FD portion. Similarly, the signal holding unit 15 is connected to the reset transistor 21 and the amplification transistor 24. That is, the signal holding unit 15 functions as a second FD portion.

FIG. 3 and FIG. 4 basically illustrate the planar structure and the section structure of the pixel P including the equivalent circuit illustrated in FIGS. 5A and 5B and FIG. 6. Since the pixel circuits are different from each other, an added or deleted transistor may be appropriately added to FIG. 3 and FIG. 4. Since these changes may be appropriately made by those skilled in the art, detailed descriptions thereof will be omitted.

Planar Structure 2

Next, a modified example of the planar structure of the pixel P will be described. FIGS. 7A to 7D schematically illustrate a planar structure of the pixel P. The respective drawings illustrate the element isolation region 110, the active region 120, the semiconductor region constituting the photoelectric conversion unit 10 (hereinafter, simply referred to as the photoelectric conversion unit 10), the gate electrodes of the transfer transistors 11 and 12, and the semiconductor regions connected to the signal holding units 14 and 15 similarly as in FIG. 3. It should be noted however that reference signs of the element isolation region 110 and the active region 120 are omitted.

Figure 7A:
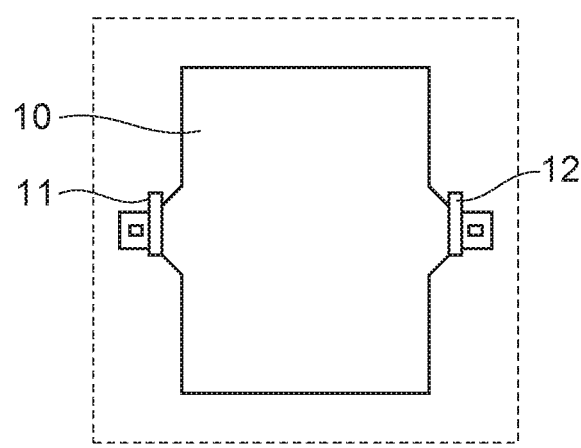
FIGS. 7A to 7D schematically illustrate a planar structure of the pixel of the imaging sensor.

In FIG. 7A, the photoelectric conversion unit 10 is arranged between the semiconductor region connected to the signal holding unit 14 and the semiconductor region connected to the signal holding unit 15. In other words, the gate electrodes of the transfer transistors 11 and 12 are arranged on a side opposite to the photoelectric conversion unit 10. In this layout, the transfer paths of the charges based on the two transfer transistors 11 and 12 are coaxial and also in opposite directions.

Figure 7B:
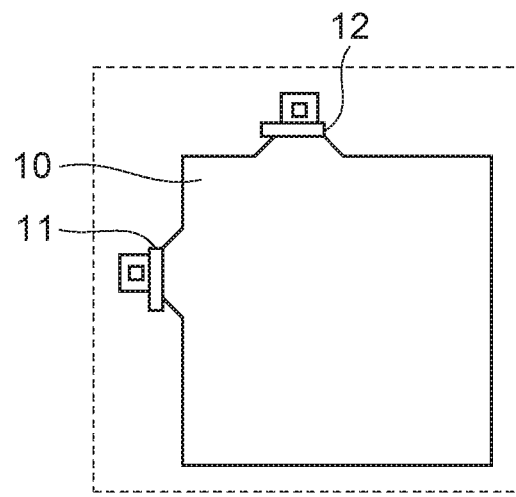

In FIG. 7B, the gate electrodes of the transfer transistors 11 and 12 are arranged on two sides adjacent to the photoelectric conversion unit 10. In this layout, the transfer paths of the charges based on the two transfer transistors 11 and 12 are in directions intersecting with each other.

Figure 7C:
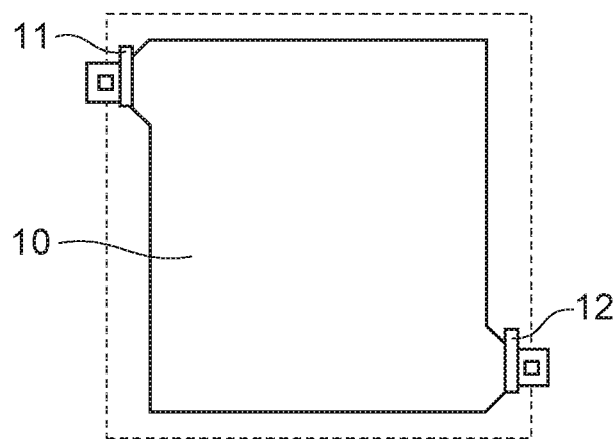

In FIG. 7C, transfer gate electrodes of the transfer transistors 11 and 12 are arranged so as to be close to two facing corners of the photoelectric conversion unit 10. In this layout, the transfer paths of the charges based on the two transfer transistors 11 and 12 are in opposite directions. In addition, axes of the transfer paths of the charges based on the two transfer transistors 11 and 12 are mutually offset.

Figure 7D:
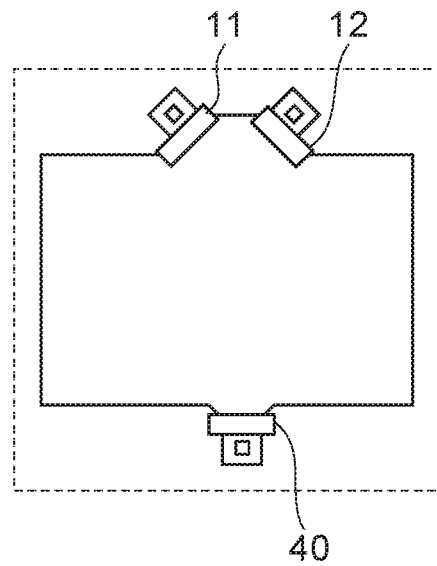

FIG. 7D illustrates an example in which the pixel P includes the charge discharging transistor 40. The charge discharging transistor 40 is arranged on the first substrate. A gate electrode of the charge discharging transistor 40 is arranged on a side opposite to the gate electrodes of the transfer transistors 11 and 12.

Section Structure 2

Figure 8A:
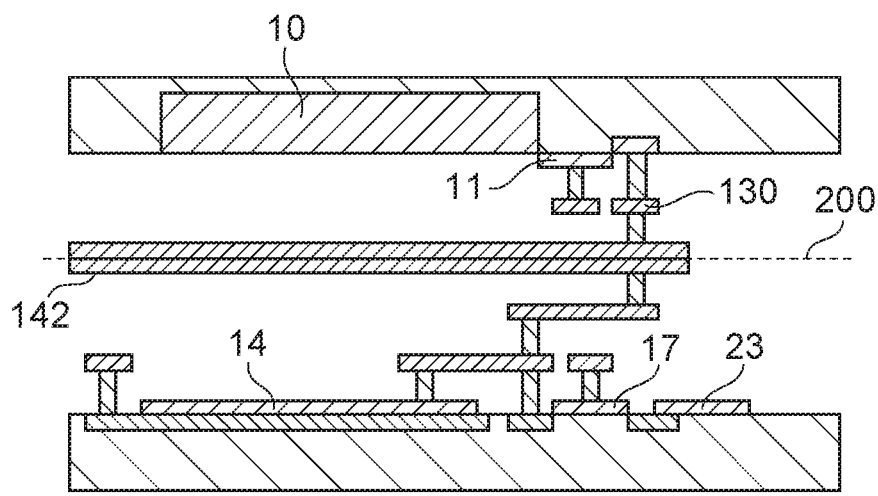
FIGS. 8A to 8C schematically illustrate a section structure of the pixel of the imaging sensor.
Figure 8B:
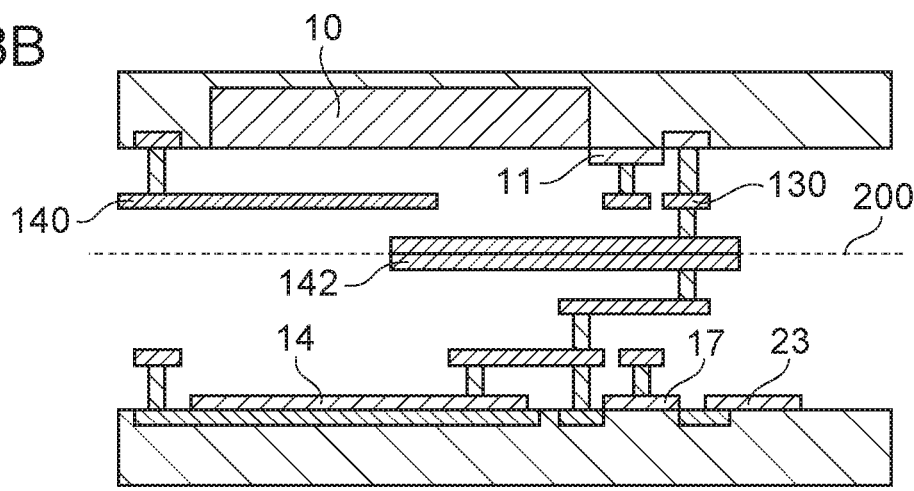
Figure 8C:
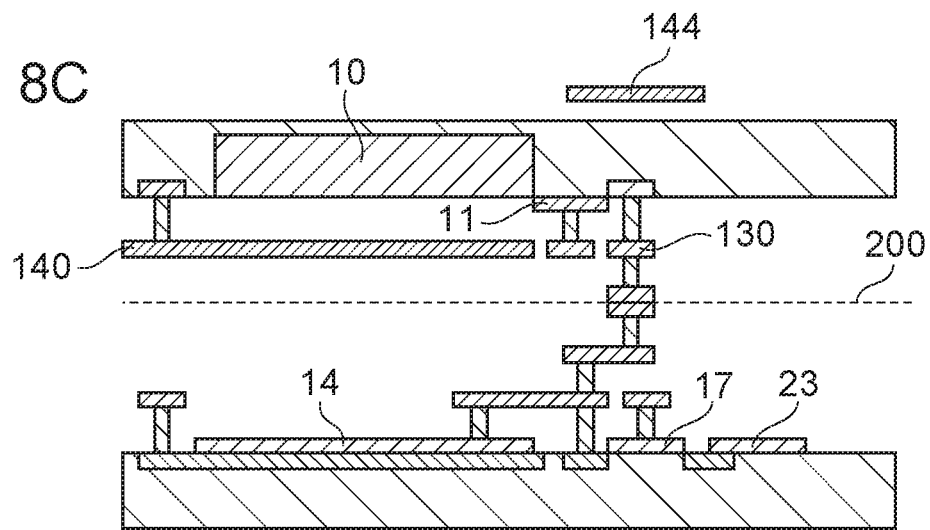

Next, a modified example of the light shielding portion 140 will be described. FIGS. 8A to 8C schematically illustrate a section structure of the pixel P. The same part as that in FIG. 4 is assigned with the same reference sign.

In the example of FIG. 8A, a light shielding portion 142 is arranged instead of the light shielding portion 140. The light shielding portion 142 includes the bonding portion 200 between the lines. The light shielding portion 142 also serves as a line that connects the element of the first substrate and the element of the second substrate to each other. According to the above-described configuration, it is possible to increase the area of the bonding portion 200 formed when the two substrates are bonded to each other. As a result, it is possible to attain benefits such as a decrease in a line resistance and suppression of a decrease in a yield.

In the example of FIG. 8B, the signal holding unit 14 is shielded from light by both the light shielding portion 140 described with reference to FIG. 4 and the light shielding portion 142 described with reference to FIG. 8A. In a case where the light shielding portion also serves as the line, an arrangement of the line may be limited because of a restriction of the circuit in some cases. When the light shielding portion is constituted by lines in a plurality of layers as illustrated in FIG. 8B, the limitation in the line arrangement is reduced. As a result, it is possible to attain high light shielding performance. It should be noted that, in a case where the light shielding portion is constituted by a plurality of line layers, the plurality of line layers are overlapped with each other. With this configuration, it is possible to further increase the light shielding performance.

In the example of FIG. 8C, a light shielding portion 144 that shields the semiconductor regions connected to the signal holding units 14 and 15 of the first substrate from light is arranged. The light shielding portion 144 is arranged on a light incident surface side of the first substrate. According to the above-described configuration, it is possible to suppress noise generation in the signal holding units 14 and 15.

Figure 9A:
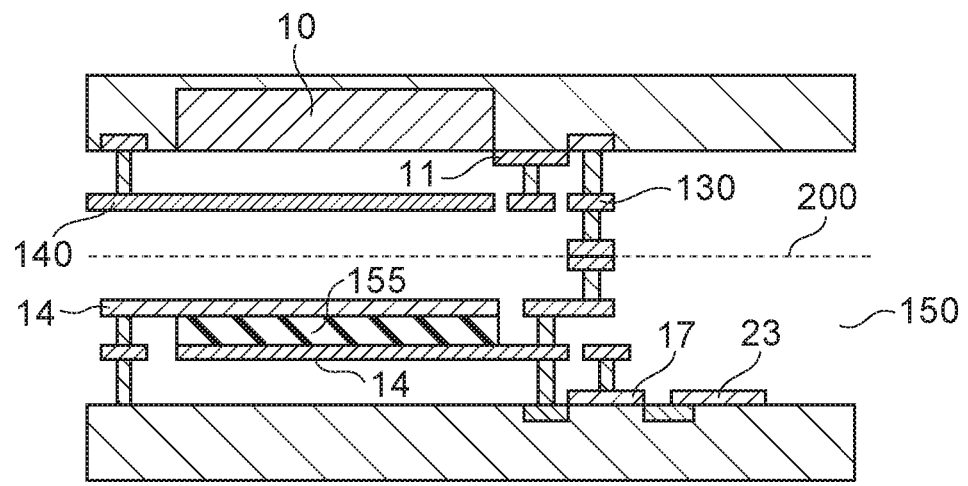
FIGS. 9A and 9B schematically illustrate a section structure of the pixel of the imaging sensor.
Figure 9B:
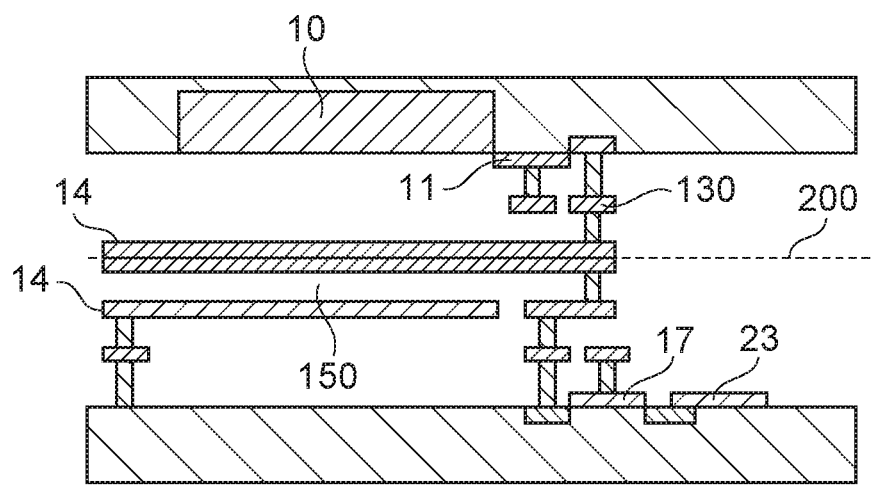

Next, modified examples of the signal holding units 14 and 15 will be described. FIGS. 9A and 9B schematically illustrate a section structure of the pixel P. The same part as that in FIG. 4 is assigned with the same reference sign.

In the example of FIG. 9A, the signal holding unit 14 includes a pair of electrodes constituted by the lines in the two layers. That is, the signal holding unit 14 has an MIM structure. Although not illustrated in the drawing, the signal holding unit 15 may also similarly have the MIM structure. An insulation layer 155 having a dielectric constant higher than that of an interlayer insulating film 150 may be arranged between the pair of electrodes. According to the above-described configuration, it is possible to increase the capacitances of the signal holding units 14 and 15. Instead of the insulation layer 155, the interlayer insulating film 150 may be arranged between the pair of electrodes. A PIP structure including two polysilicon electrodes may be applied to the signal holding units 14 and 15 instead of the MIM structure.

In the example of FIG. 9B, one of the pair of electrodes of the signal holding unit 14 includes the bonding portion 200. According to the above-described configuration, it is possible to increase the area of the bonding portion 200 formed when the two substrates are bonded to each other. As a result, it is possible to attain the benefits such as the decrease in the line resistance and the suppression of the decrease in the yield.

As described above, according to the present exemplary embodiment, the two signal holding units 14 and 15 of the pixel P are arranged on the second substrate. For this reason, it is possible to increase the area occupied by the photoelectric conversion unit 10 in the first substrate. As a result, it is possible to improve the sensitivity.

Second Exemplary Embodiment

The imaging sensor according to a second exemplary embodiment will be described. The second exemplary embodiment is different from the first exemplary embodiment in that three transfer transistors 11, 12, and 13 are connected to the single photoelectric conversion unit 10. Mainly, different points between the first exemplary embodiment and the second exemplary embodiment will be described. Descriptions of the same part as the first exemplary embodiment will be appropriately omitted.

Overall Block Diagram

FIG. 1 is the block diagram schematically illustrating the configuration example of the imaging sensor according to the present exemplary embodiment. The imaging sensor includes the CPU 101, the control unit 102, the vertical scanning unit 103, the pixel portion 104, the column circuit 105, the horizontal scanning unit 106, and the signal output unit 107. Configurations and functions of these blocks are the same as those according to the first exemplary embodiment. For this reason, detailed descriptions of FIG. 1 will be omitted.

The imaging sensor is provided with the first substrate and the second substrate. Each of the first substrate and the second substrate is a semiconductor substrate formed of a semiconductor material such as silicon. The elements constituting the respective blocks illustrated in FIG. 1 are arranged on the first substrate or the second substrate.

Pixel Circuit

Figure 10:
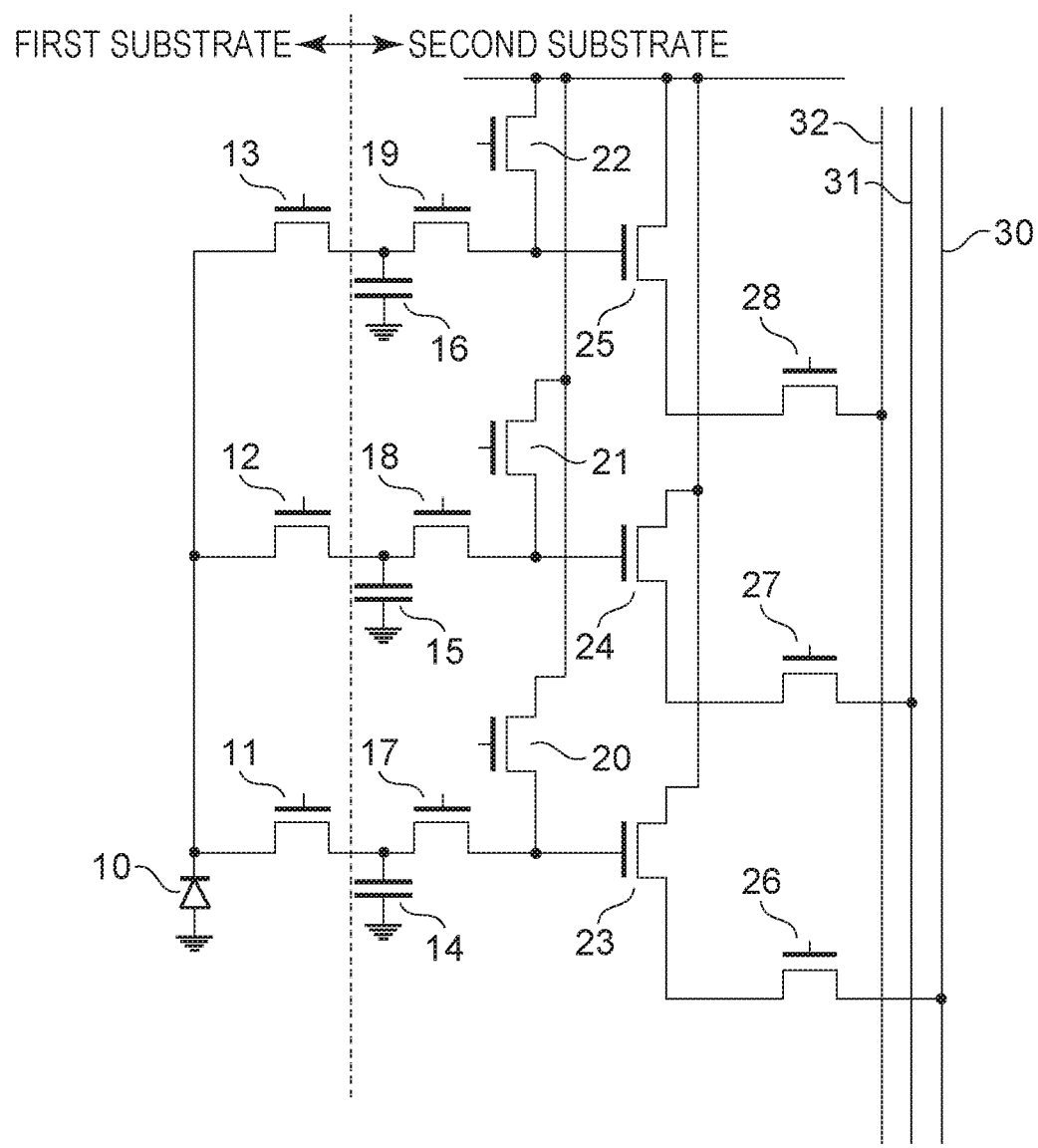
FIG. 10 illustrates an equivalent circuit of the pixel of the imaging sensor.

FIG. 10 illustrates an equivalent circuit of the pixel P of the imaging sensor. The pixel P includes the photoelectric conversion unit 10. The photoelectric conversion unit 10 generates charges in accordance with incident light. The photoelectric conversion unit 10 is a photodiode, for example. The pixel P includes the transfer transistors 11, 12, and 13 and signal holding units 14, 15, and 16. Furthermore, the pixel P includes the FD portion, reset transistors 20, 21, and 22, amplification transistors 23, 24, and 25, and selection transistors 26, 27, and 28. Although different reference signs are assigned for distinguishing the elements from one another, the elements having the same name are provided with the same function.

All the transfer transistors 11, 12, and 13 are connected to the photoelectric conversion unit 10. The transfer transistor 11 transfers the charges generated in the photoelectric conversion unit 10 from the photoelectric conversion unit 10 to the signal holding unit 14. The transfer transistor 12 transfers the charges generated in the photoelectric conversion unit 10 from the photoelectric conversion unit 10 to the signal holding unit 15. The transfer transistor 13 transfers the charges generated in the photoelectric conversion unit 10 from the photoelectric conversion unit 10 to the signal holding unit 16. With the above-described configuration, the three transfer transistors 11, 12, and 13 form three paths parallel to one another. That is, each of the three transfer transistors 11, 12, and 13 is a transfer unit that transfers the charges of the photoelectric conversion unit 10. A path for the transfer of the charges is a channel of the transistor, for example.

The pixel P includes the second transfer transistors 17, 18, and 19. The second transfer transistor 17 transfers the signal of the signal holding unit 14 to the FD portion. The second transfer transistor 18 transfers the signal of the signal holding unit 15 to the FD portion. The second transfer transistor 19 transfers a signal of the signal holding unit 16 to the FD portion. The second transfer transistors 17, 18, and 19 form three paths parallel to one another.

The transfer transistor 11 and the second transfer transistor 17 form a serial signal path between the photoelectric conversion unit 10 and the FD portion. Similarly, the transfer transistor 12 and the second transfer transistor 18 form a serial signal path. Similarly, the transfer transistor 13 and the second transfer transistor 19 form a serial signal path.

The amplification transistor 23 outputs the signal in accordance with the voltage of the FD portion to the signal line 30. The selection transistor 26 connects the amplification transistor 23 and the signal line 30 to each other. When on and off of the selection transistor 26 are switched, it is possible to select one or a plurality of pixels P that output the signal among the plurality of pixels P. The reset transistor 20 resets the voltage of the FD portion corrected to the gate of the amplification transistor 23 to a predetermined value.

The amplification transistor 24 outputs the signal in accordance with the voltage of the FD portion to the signal line 31. The selection transistor 27 connects the amplification transistor 24 and the signal line 31 to each other. When on and off of the selection transistor 27 are switched, it is possible to select one or a plurality of pixels P that output the signal among the plurality of pixels P. The reset transistor 21 resets the voltage of the FD portion corrected to the gate of the amplification transistor 24 to a predetermined value.

The amplification transistor 25 outputs the signal in accordance with the voltage of the FD portion to a signal line 32. The selection transistor 28 connects the amplification transistor 25 and the signal line 32 to each other. When on and off of the selection transistor 28 are switched, it is possible to select one or a plurality of pixels P that output the signal among the plurality of pixels P. The reset transistor 22 resets the voltage of the FD portion connected to the gate of the amplification transistor 25 to a predetermined value.

The photoelectric conversion unit 10 and the transfer transistors 11, 12, and 13 of the pixel P are arranged on the first substrate. The signal holding units 14, 15, and 16 and the second transfer transistors 17, 18, and 19 of the pixel P are arranged on the second substrate. In addition, the reset transistors 20, 21, and 22, the amplification transistors 23, 24, and 25, and the selection transistors 26, 27, and 28 of the pixel P are arranged on the second substrate.

It should be noted that the configuration of the pixel P illustrated in FIGS. 5A and 5B and FIG. 6 can be appropriately combined with the pixel P of FIG. 10. For example, the charge discharging transistor 40 of FIG. 5A may be connected to the photoelectric conversion unit 10. In addition, the second transfer transistors 17, 18, and 19 and the selection transistors 26, 27, and 28 may be omitted. As illustrated in FIG. 5B, the plurality of photoelectric conversion units 10 may share one pair of the amplification transistor and the reset transistor.

Figure 11:
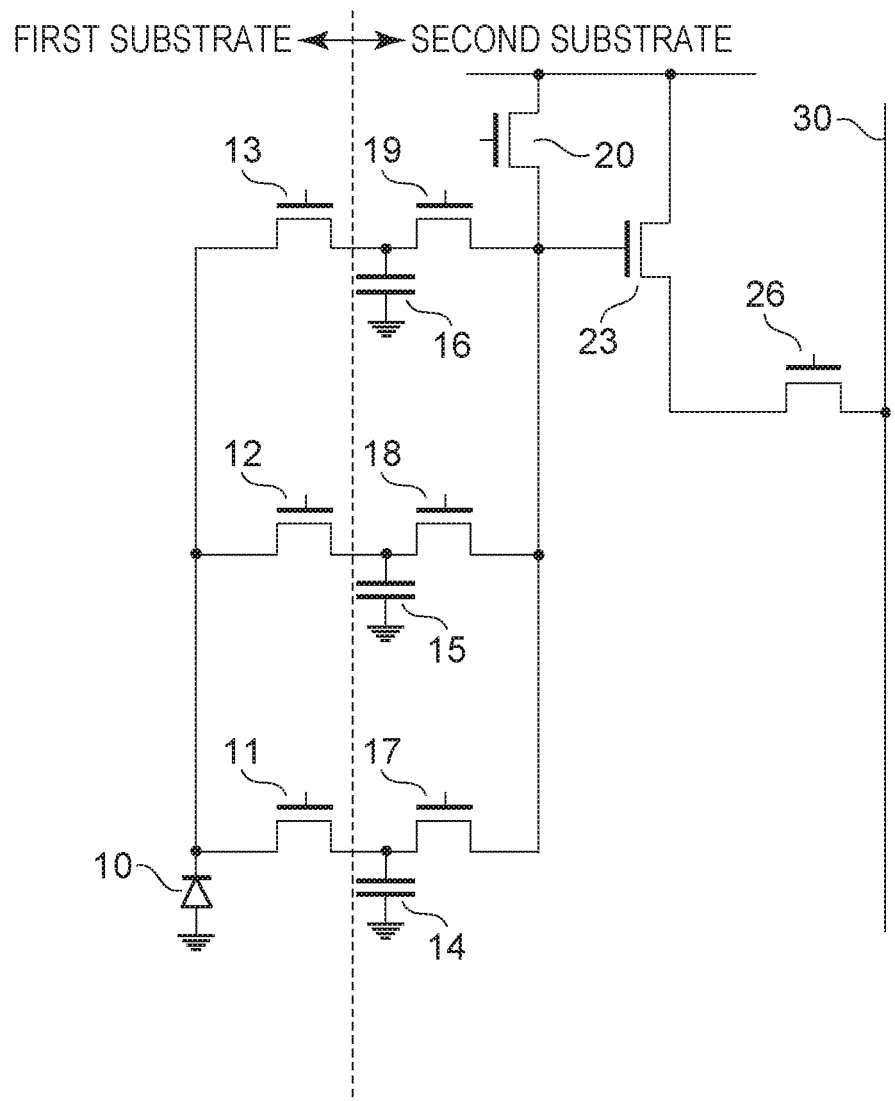
FIG. 11 illustrates an equivalent circuit of the pixel of the imaging sensor.

The three signal holding units 14, 15, and 16 may be connected to the common FD portion like the circuit illustrated in FIG. 11. According to the above-described configuration, it is possible to decrease the number of amplification transistors. As a result, it is possible to reduce the circuit scale.

Planar Structure 1

Figure 12A:
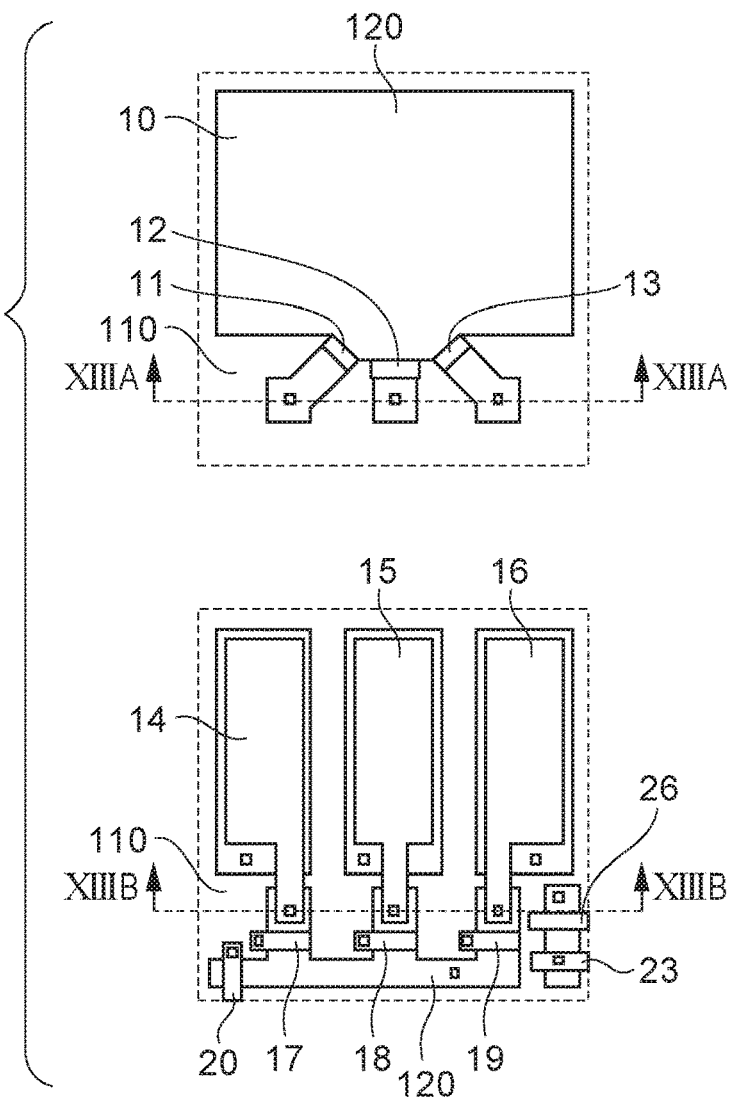
FIGS. 12A and 12B schematically illustrate a planar structure of the pixel of the imaging sensor.
Figure 12B:
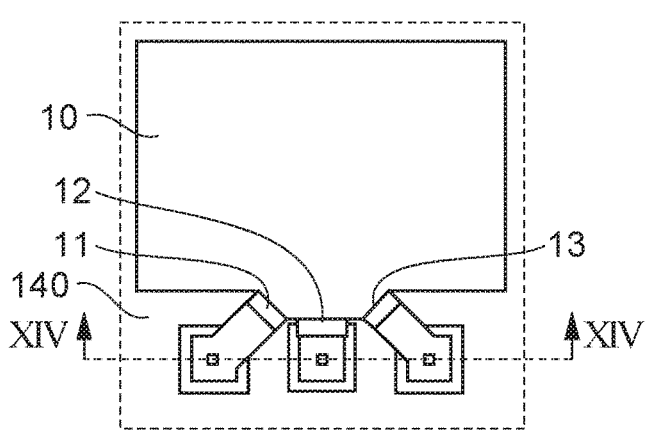

FIGS. 12A and 12B schematically illustrate a planar structure of the pixel P. A section arranged on the first substrate of the pixel P is illustrated on an upper side of FIG. 12A. A section arranged on the second substrate of the pixel P is illustrated on a lower side of FIG. 12A. FIG. 11 illustrates an equivalent circuit diagram of the pixel P illustrated in FIG. 12A.

The element isolation region 110 such as STI or LOCOS defines the active region 120 of the first substrate. The semiconductor region constituting the photoelectric conversion unit 10 (hereinafter, simply referred to as the photoelectric conversion unit 10), and the semiconductor regions connected to the signal holding units 14, 15, and 16 are arranged in the active region 120. In the plan view with respect to the surface of the first substrate, the gate electrode of the transfer transistor 11 is arranged between the photoelectric conversion unit 10 and the semiconductor region connected to the signal holding unit 14. The gate electrode of the transfer transistor 12 is arranged between the photoelectric conversion unit 10 and the semiconductor region connected to the signal holding unit 15. The gate electrode of the transfer transistor 13 is arranged between the photoelectric conversion unit 10 and a semiconductor region connected to the signal holding unit 16.

The element isolation region 110 defines the active region 120 in the second substrate. The plurality of active regions 120 are arranged with respect to the single pixel P on the second substrate. Each of the signal holding units 14, 15, and 16 includes the electrodes formed of polysilicon and the semiconductor region arranged in the active region 120. That is, the signal holding units 14, 15, and 16 are an MIS capacitance. The ground potential is supplied to the semiconductor region of the signal holding units 14, 15, and 16. The polysilicon electrodes of the signal holding units 14, 15, and 16 are respectively connected to the semiconductor regions of the first substrate. In addition, the polysilicon electrodes of the signal holding units 14, 15, and 16 are respectively connected to the second transfer transistors 17, 18, and 19.

As illustrated in FIG. 12A, the second transfer transistors 17, 18, and 19, the reset transistor 20, the amplification transistor 23, and the selection transistor 26 are arranged in the active region 120 of the second substrate. In FIG. 12A, reference signs are assigned to the gate electrodes of the respective transistors. The two semiconductor regions on both sides of the gate electrode constitute the source and the drain.

In the plan view of FIG. 12A, the semiconductor regions arranged so as to be adjacent to the gate electrodes of the three second transfer transistors 17, 18, and 19 constitute the FD portion. A semiconductor region constituting the FD portion and the gate electrode of the amplification transistor 23 are connected to each other by a line that is not illustrated in the drawing. The power source voltage is supplied to the drain of the reset transistor 20 and the drain of the amplification transistor 23. The source of the selection transistor 26 is connected to the signal line 30.

Section Structure

Figure 13A:
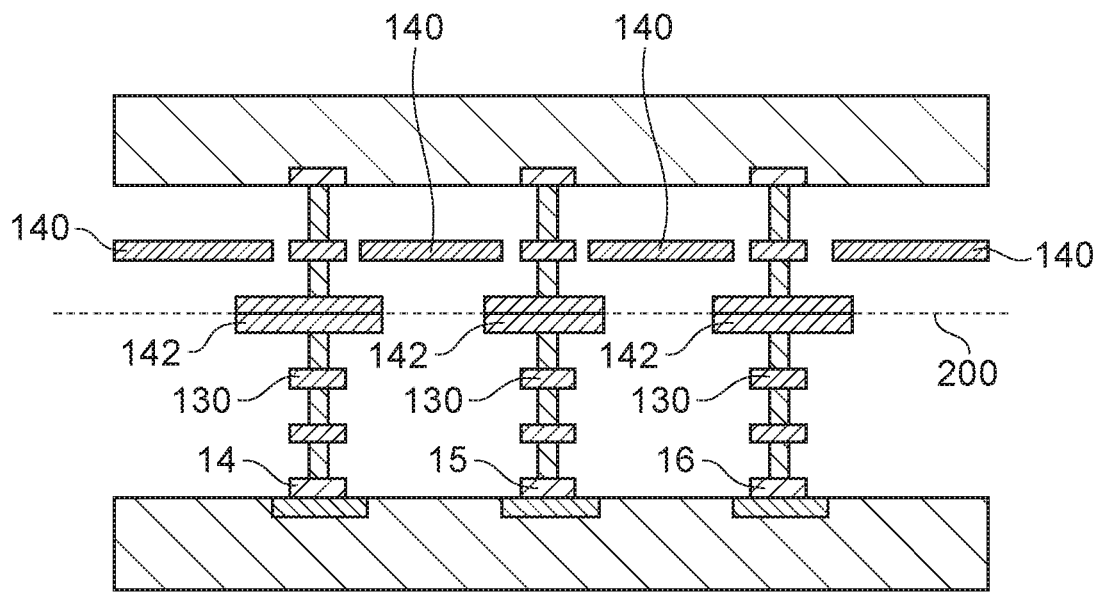
FIGS. 13A and 13B schematically illustrate a section structure of the pixel of the imaging sensor.

FIG. 13A schematically illustrates a section structure of the pixel P. FIG. 13A schematically illustrates a section along a line XIIIA-XIIIA of FIG. 12A. The same part as that in FIGS. 12A and 12B is assigned with the same reference sign as that in FIGS. 12A and 12B.

The transfer transistor 11 arranged on the first substrate and the signal holding unit 14 arranged on the second substrate are connected to each other by the line 130 arranged between the two substrates. As illustrated in FIG. 13A, the line 130 arranged between the two substrates connects the semiconductor region of the transfer transistor 11 and the electrode of the signal holding unit 14 which is formed of polysilicon to each other. The line 130 may include the bonding portion 200 between the lines. The bonding portion 200 between the lines are formed by preparing two semiconductor substrates respectively provided with lines and bonding the exposed lines to each other.

The transfer transistor 12 arranged on the first substrate is connected to the signal holding unit 15 via the line 130. The transfer transistor 13 arranged on the first substrate is connected to the signal holding unit 16 via the line 130.

In FIG. 13A, an insulating film which is not illustrated in the drawing is arranged between the polysilicon electrodes of the signal holding units 14, 15, and 16 and the semiconductor region of the second substrate.

The light shielding portion 140 is arranged between the first substrate and the second substrate. The light shielding portion 140 is arranged between the photoelectric conversion unit 10 arranged on the first substrate and the signal holding unit 14 arranged on the second substrate. The light shielding portion 140 shields light that has passed through the first substrate. The light shielding portion 140 is constituted by a metallic member such as aluminum, copper, or tungsten. With the above-described configuration, since the light incidence on the signal holding unit 14 can be avoided, it is possible to reduce the noise. The light shielding portion 140 may also serves as the line that supplies the potential to the well of the first substrate.

Furthermore, the light shielding portion 140 is arranged between the photoelectric conversion unit 10 and the signal holding unit 15 arranged on the second substrate. In addition, the light shielding portion 140 is arranged between the photoelectric conversion unit 10 and the signal holding unit 16 arranged on the second substrate. With the above-described arrangement, it is possible to reduce the noise in any one of the signal holding units.

A planar structure of the light shielding portion 140 will be described. FIG. 12B schematically illustrates a planar structure of the pixel P. The structure illustrated in FIG. 12B is obtained by adding the light shielding portion 140 to the planar diagram of the first substrate on an upper side of FIG. 12A. The other configurations are the same as FIG. 12A.

In the plan view with respect to the surface of the first substrate, the light shielding portion 140 is arranged so as to be overlapped with the entirety of the photoelectric conversion unit 10. In addition, the three signal holding units 14, 15, and 16 individually arranged on the second substrate are covered with the single continuous light shielding portion 140. On the other hand, the light shielding portion 140 has an opening to electrically connect the first substrate and the second substrate to each other. Lines are arranged so as to respectively connect the transfer transistors 11, 12, and 13 of the first substrate to the signal holding units 14, 15, and 16 of the second substrate through the opening.

To avoid signal crosstalk, the light shielding portion 140 is electrically isolated from the line 130 that connects the two substrates to each other. For this reason, gap is generated in the vicinity of the line 130. In view of the above, as illustrated in FIG. 13A, the line 130 or a line connected to the line 130 is arranged so as to overlap with the opening of the light shielding portion 140. In FIG. 13A, the light shielding portion 142 is connected to the line 130. The light shielding portion 142 is arranged so as to cover the entirety of the opening of the light shielding portion 140 in the plan view. According to the above-described configuration, it is possible to avoid the noise generation by the light incident on the signal holding unit. It should be noted that, according to this exemplary embodiment, the light shielding portion 142 includes the bonding portion 200 between the lines. According to the above-described configuration, it is possible to suppress the decrease in the yield.

Figure 13B:
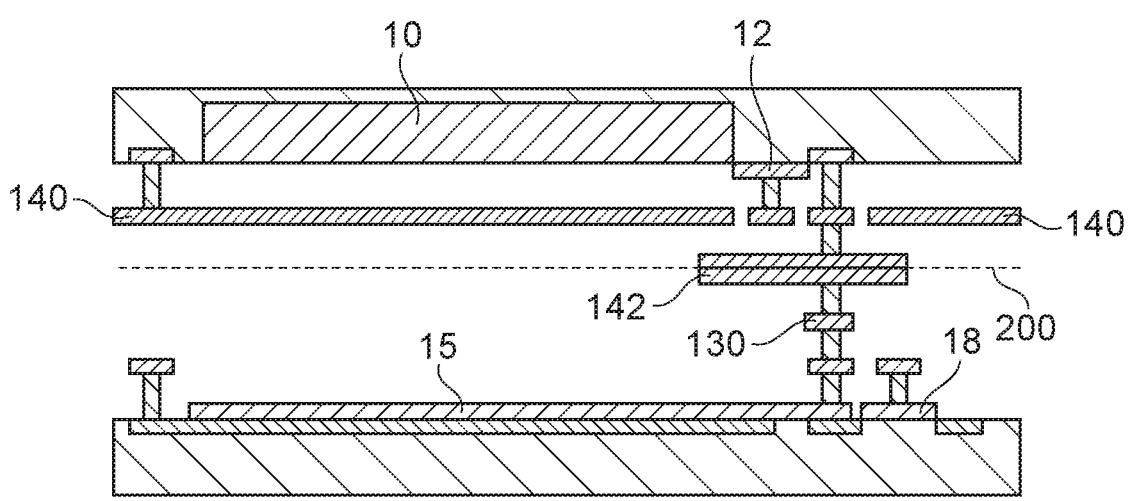

FIG. 13B schematically illustrates a section structure of the pixel P along a line orthogonal to the line XIIIB-XIIIB of FIG. 12B. The same component as FIG. 13A is assigned with the same reference sign. As illustrated in FIG. 13B, the light shielding portion 142 covers the opening of the light shielding portion 140 in this section too. At this time, since the light shielding portion 140 and the light shielding portion 142 are partially overlapped with each other, it is possible to attain the higher light shielding performance.

As described above, the three transfer transistors 11, 12, and 13 are connected to the single photoelectric conversion unit 10 in the imaging sensor according to the present exemplary embodiment. The above-described configuration is adopted when time-correlated exposure is performed. According to the time-correlated exposure, opening degrees of the gates of the plurality of transistors are varied from one another. Furthermore, states with regard to the opening degrees of the gates of the plurality of transistors change over time. When the above-described driving is performed, it is possible to perform imaging of the object and also obtain additional information such as distance information of the object.

Figure 14:
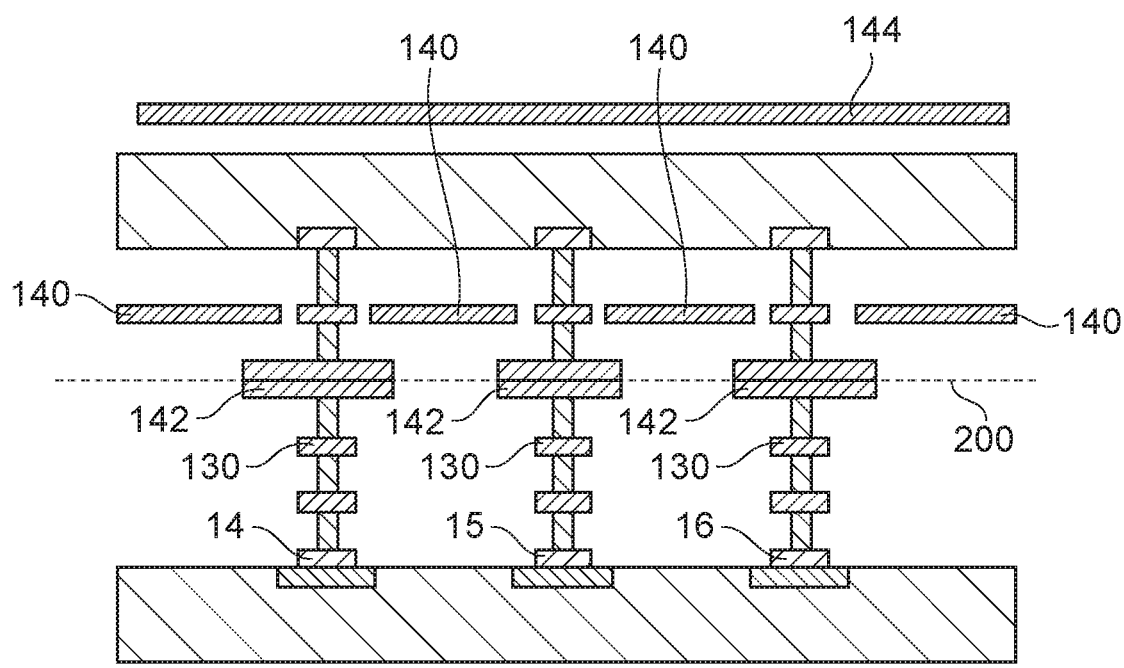
FIG. 14 schematically illustrates a section structure of the pixel of the imaging sensor.

Each of the configurations illustrated in FIGS. 8A to 8C is used for the light shielding portion according to the present exemplary embodiment. The descriptions according to the first exemplary embodiment are all applied to FIGS. 8A to 8C. For example, FIG. 14 illustrates an example in which the light shielding portion 144 is arranged on the light incident surface side of the first substrate. The single continuous light shielding portion 144 covers the plurality of connection portions. The other part in FIG. 14 is the same as that in FIG. 13A. It should be noted that, since the light shielding portion is provided in accordance with a specification, the light shielding portion may also be removed. In addition, each of the configurations illustrated in FIGS. 9A and 9B is used for the signal holding unit according to the present exemplary embodiment. The descriptions according to the first exemplary embodiment are all applied to FIGS. 9A and 9B.

Planar Structure 2

Next, a modified example of the planar structure of the pixel P will be described with reference to FIGS. 15A to 15D and FIGS. 16A and 16B. FIGS. 15A to 15D schematically illustrate a planar structure of the pixel P. Similarly as in FIGS. 12A and 12B, the respective drawings illustrate the element isolation region 110, the active region 120, the photoelectric conversion unit 10 (semiconductor region constituting the photoelectric conversion unit 10), the gate electrodes of the transfer transistors 11, 12, and 13, and the semiconductor regions connected to the signal holding units 14, 15, and 16. It should be noted however that reference signs for the element isolation region 110 and the active region 120 are omitted.

Figure 15A:
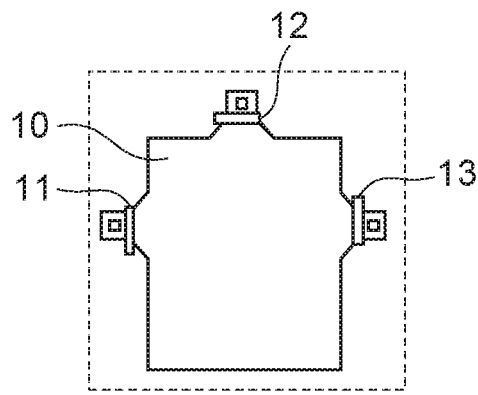
FIGS. 15A to 15D schematically illustrate a planar structure of the pixel of the imaging sensor.
Figure 15B:
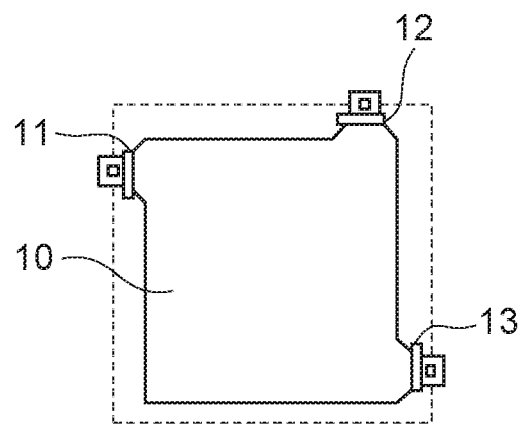

In FIG. 15A, the gate electrodes of the transfer transistors 11, 12, and 13 are respectively arranged on three sides of the photoelectric conversion unit 10. In FIG. 15B, the gate electrodes of the transfer transistors 11, 12, and 13 are respectively arranged in the vicinity of three corners of the photoelectric conversion unit 10. In the layouts of FIG. 15A and FIG. 15B, the charges generated in the photoelectric conversion unit 10 are substantially equally distributed to the three transfer transistors 11, 12, and 13.

Figure 15C:
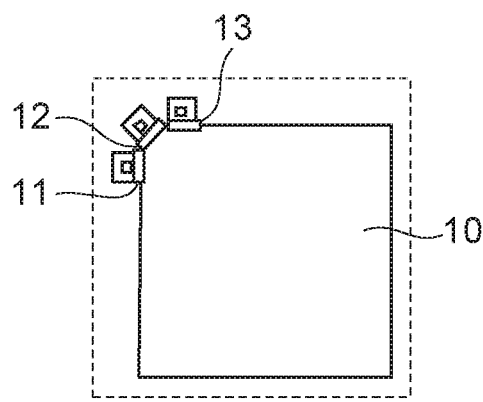

In FIG. 15C, the gate electrodes of the three transfer transistors 11, 12, and 13 are concentrated and arranged in the vicinity of one corner of the photoelectric conversion unit 10. According to the above-described configuration, the lines 130 that connect the first substrate to the second substrate can be arranged so as to be adjacent to each other. Since the area of the opening of the light shielding portion 140 can be decreased, it is possible to suppress the noise.

Figure 15D:
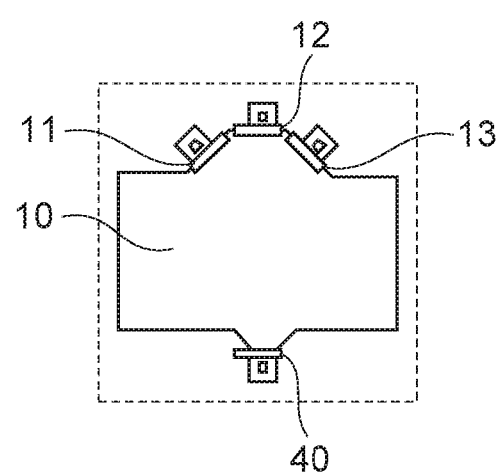

FIG. 15D illustrates an example in which the pixel P includes the charge discharging transistor 40. The charge discharging transistor 40 is provided on the first substrate. According to the present exemplary embodiment, the gate electrode of the charge discharging transistor 40 is provided on a side opposite to the gate electrodes of the transfer transistors 11, 12, and 13.

In addition, the photoelectric conversion unit 10 illustrated in FIG. 15D has a convex portion. The gate electrodes of the three transfer transistors 11, 12, and 13 are arranged in the surrounding of the convex portion. According to the above-described configuration, transfer characteristics of the respective transfer transistors can be aligned with one another.

Figure 16A:
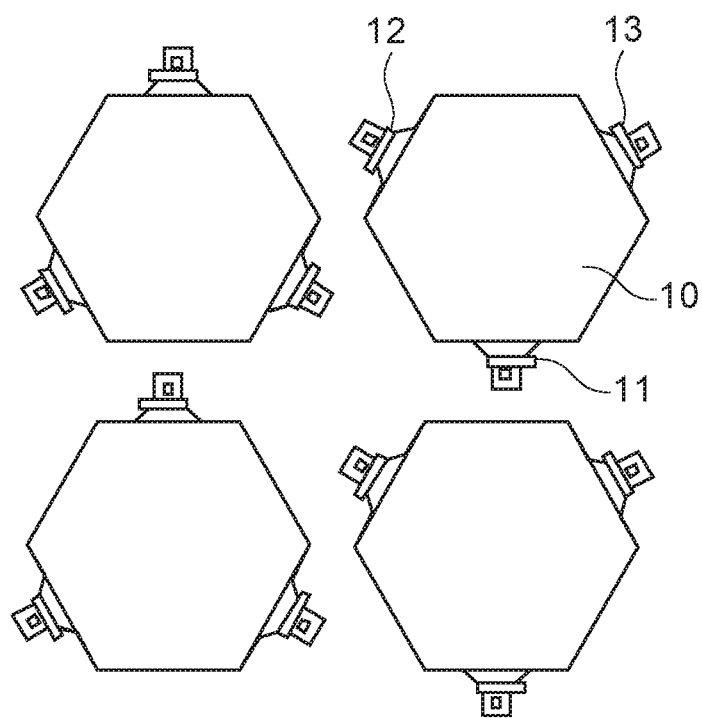
FIGS. 16A and 16B schematically illustrate a planar structure of the pixel of the imaging sensor.
Figure 16B:
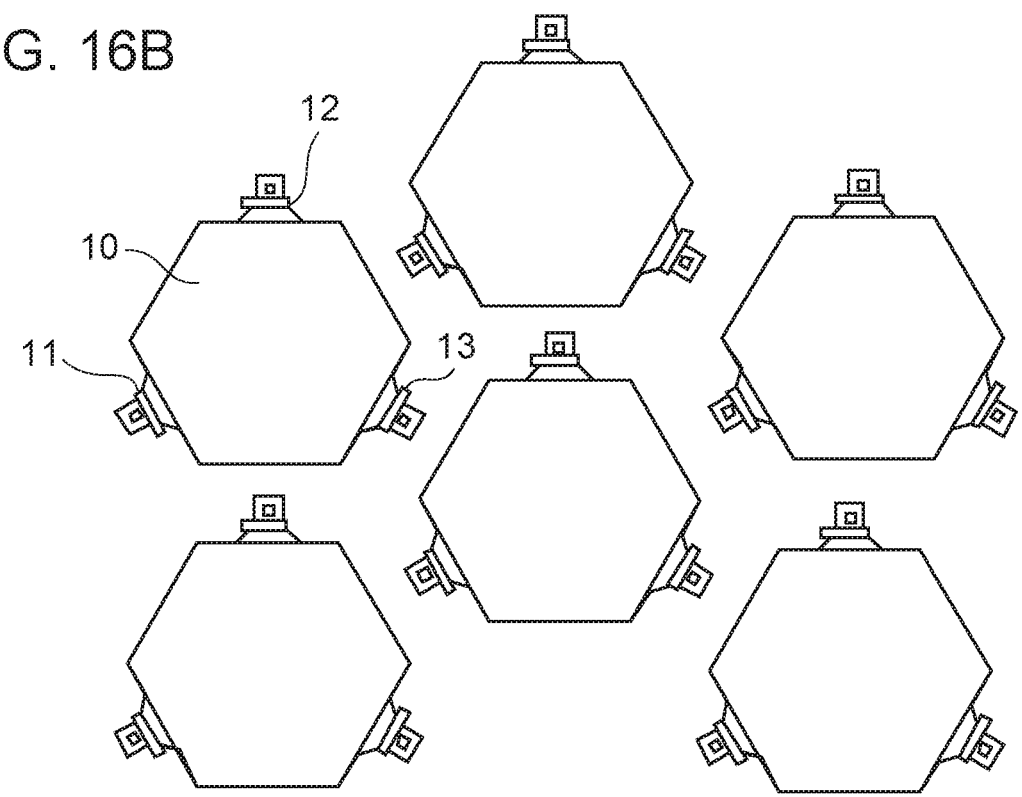

FIGS. 16A and 16B schematically illustrate a planar structure of the plurality of pixels P. FIG. 16A illustrates the four pixels P, and FIG. 16B illustrates the six pixels P. The respective drawings illustrate the element isolation region 110, the active region 120, the photoelectric conversion unit 10, the gate electrodes of the transfer transistors 11, 12, and 13, and the semiconductor regions connected to the signal holding units 14, 15, and 16 similarly as in FIGS. 12A and 12B. It should be noted however that reference signs for the element isolation region 110 and the active region 120 are omitted.

The photoelectric conversion unit 10 illustrated in FIG. 16A has a shape resembling like a hexagon. That is, the photoelectric conversion unit 10 has six sides, and the gate electrodes of the transfer transistors 11, 12, and 13 are arranged on every two sides. In one embodiment, the gate electrodes of the transfer transistors 11, 12, and 13 are mutually arranged at equal intervals. According to the above-described configuration, it is possible for the three transfer transistors 11, 12, and 13 to transfer the substantially equal amount of charges generated in the photoelectric conversion unit 10. As a result, it is possible to improve the accuracy of the above-described time-correlated exposure.

In FIG. 16B, the plurality of pixels P arranged in one row are arranged while being shifted in a direction intersecting with the row. The photoelectric conversion unit 10 has a shape resembling like a hexagon similarly as in FIG. 16A. With the above-described configuration, the intervals of the photoelectric conversion units 10 can be set to be uniform, and it is possible to suppress the decrease in the image quality caused by color mixing or the like. In addition, in the layout illustrated in FIG. 16B, the planar structures of the plurality of pixels P mutually have a translational symmetry relationship. For this reason, the characteristics of the pixels P can be set to be uniform.

As described above, according to the present exemplary embodiment, the three signal holding units 14, 15, and 16 of the pixel P are arranged on the second substrate. For this reason, it is possible to increase the area occupied by the photoelectric conversion unit 10 in the first substrate. As a result, it is possible to improve the sensitivity.

In addition, since the pixel P includes the three signal holding units 14, 15, and 16, it is effective for an advancement in the function of the imaging sensor such as the time-correlated exposure.

Third Exemplary Embodiment

The imaging sensor according to another exemplary embodiment will be described. The imaging sensor according to the first exemplary embodiment and the second exemplary embodiment has a configuration in which light enters from a surface where the lines and the like of the first substrate are not formed, that is, a rear side. The imaging sensor according to the first exemplary embodiment and the second exemplary embodiment is of a so-called rear-side illuminated type. In contrast to this, the imaging sensor according to the present exemplary embodiment is a front-side illuminated imaging sensor.

The overall configuration and the circuit of the pixel P according to the present exemplary embodiment are the same as the first exemplary embodiment or the second exemplary embodiment.

Figure 17:
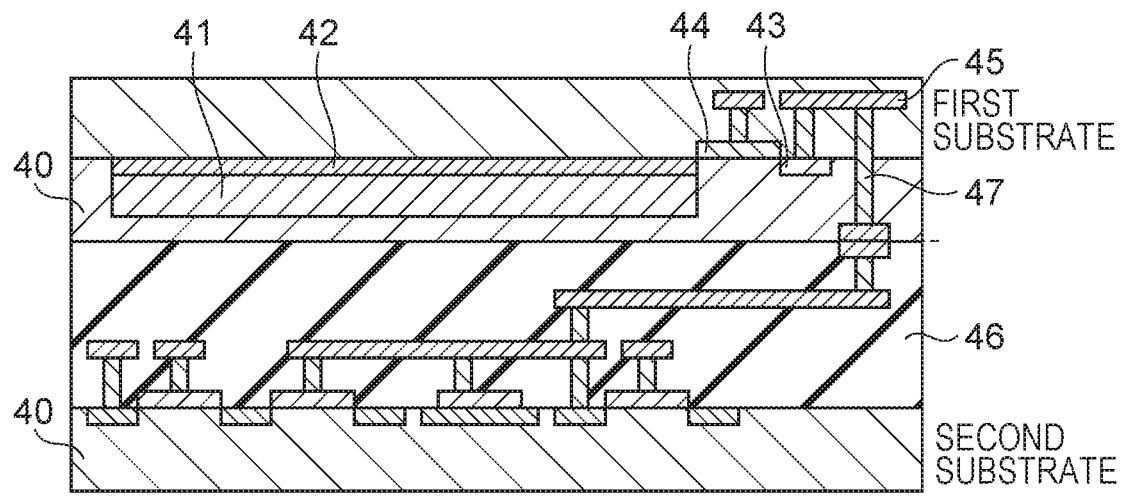
FIG. 17 schematically illustrates a section structure of the pixel of the imaging sensor.

FIG. 17 schematically illustrates a section of the pixel P of the imaging sensor. An N-type semiconductor region 41 and a P-type surface region 42 constituting the photoelectric conversion unit 10 are arranged on the first substrate. The N-type semiconductor region 41 is arranged in a P-type well 40. An N-type semiconductor region 43 connected to one of the signal holding units 14, 15, and 16 are arranged in the P-type well 40. A gate electrode 44 of one of the transfer transistors 11, 12, and 13 is arranged on a light incident surface of the first substrate.

According to the present exemplary embodiment too, the signal holding units 14, 15, and 16 are arranged on the second substrate. The semiconductor regions of the first substrate and the signal holding units 14, 15, and 16 on the second substrate are connected to each other.

A through-hole is formed in the first substrate. A line 47 that connects the semiconductor region 43 and the signal holding unit of the second substrate to each other is arranged in the through-hole. An interlayer insulating film 46 is arranged between the first substrate and the second substrate. The line 47 is connected to the signal holding unit via a line of the interlayer insulating film 46.

As described above, according to the present exemplary embodiment, the plurality of signal holding units of the pixel P are arranged on the second substrate. For this reason, it is possible to increase the area occupied by the photoelectric conversion unit 10 in the first substrate. As a result, it is possible to improve the sensitivity.

In particular, the sensitivity tends to decrease by the line on the incident surface side in the front-side illuminated imaging sensor. For this reason, the benefits of the sensitivity improvement based on the configuration according to the present exemplary embodiment are conspicuous.

Fourth Exemplary Embodiment

The imaging sensor according to another exemplary embodiment will be described. The imaging sensor according to the first to third exemplary embodiments includes a configuration in which the charges are transferred in a direction horizontal to the surface of the substrate in the first substrate. On the other hand, the imaging sensor according to the present exemplary embodiment includes a configuration in which the charges are transferred in a depth direction of the substrate.

The overall configuration and the circuit of the pixel P according to the present exemplary embodiment are the same as those of the first exemplary embodiment or the second exemplary embodiment.

Figure 18:
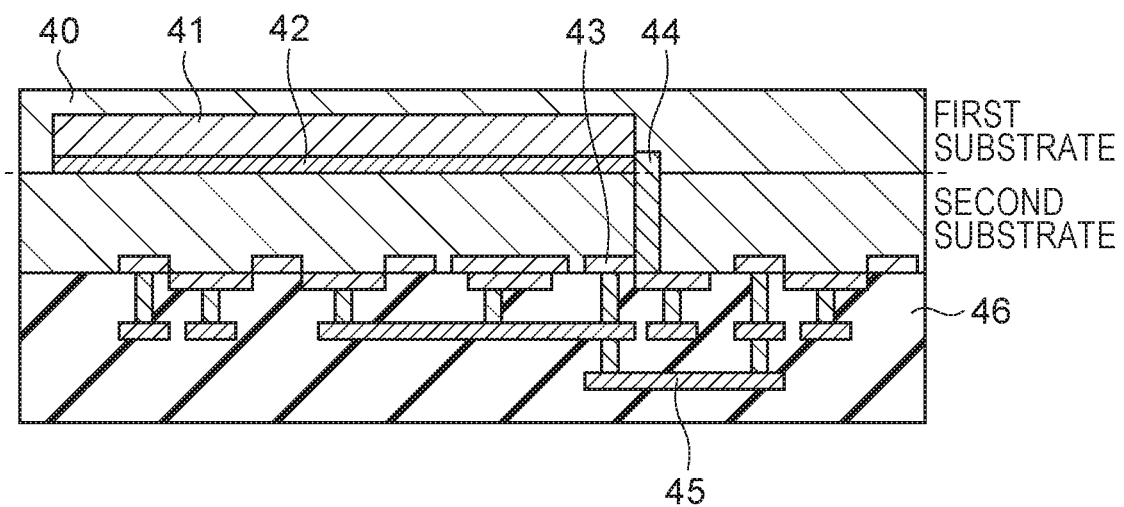
FIG. 18 schematically illustrates a section structure of the pixel of the imaging sensor.

FIG. 18 schematically illustrates a section of the pixel P of the imaging sensor. The same part as that in FIG. 17 is assigned with the same reference sign. According to the present exemplary embodiment, each of the transfer transistors 11, 12, and 13 includes a transfer gate electrode 44. As illustrated in FIG. 18, the transfer gate electrode 44 is embedded in the second substrate. The transfer gate electrode 44 transfers the charges from the N-type semiconductor region 41 constituting the photoelectric conversion unit 10 of the first substrate to a charge holding region 43 of the second substrate. The charge holding region 43 is an N-type semiconductor region constituting the signal holding unit.

According to the above-described configuration, the signal holding unit can hold the signal generated in the photoelectric conversion unit 10 in a state of the charges. Since the signal can be read out from the signal holding unit by complete depletion transfer, it is possible to reduce the noise.

In addition, according to the present exemplary embodiment, the plurality of signal holding units of the pixel P are arranged on the second substrate. For this reason, it is possible to increase the area occupied by the photoelectric conversion unit 10 in the first substrate. As a result, it is possible to improve the sensitivity.

Fifth Exemplary Embodiment

Another exemplary embodiment will be described. A configuration of the transfer unit according to the present exemplary embodiment is different from the transfer transistors 11, 12, and 13 according to the first to fourth exemplary embodiments.

The pixel P according to the present exemplary embodiment includes an amplification circuit arranged on the first substrate. The amplification circuit is connected to the photoelectric conversion unit 10 directly or via a transfer transistor. The amplification circuit is a source follower circuit, a source ground circuit, a differential amplification circuit, or a comparator, for example. Two transfer transistors that form signal paths parallel to each other are connected to an output node of the amplification circuit. The two transfer transistors are connected to the two signal holding units. Then, a line that connects the transfer transistor to the signal holding unit is arranged between the first substrate and the second substrate.

An equivalent circuit of the pixel P according to the present exemplary embodiment is obtained by inserting an amplification circuit between the photoelectric conversion unit 10 and the transfer transistors 11 and 12 to the equivalent circuit of FIG. 2. A transfer transistor may also be arranged between the photoelectric conversion unit 10 and the amplification circuit. The transfer transistors 11 and 12 according to the present exemplary embodiment may be arranged on the first substrate or may also be arranged on the second substrate.

The transfer transistors 11, 12, and 13 according to the first to fourth exemplary embodiments transfer the signals in a state of the charges. In contrast to this, the transfer transistor according to the present exemplary embodiment transfers a voltage signal or a current signal. According to the above-described configuration, the pixel P can have an advanced function such as analog-to-digital conversion.

Sixth Exemplary Embodiment

Figure 19:
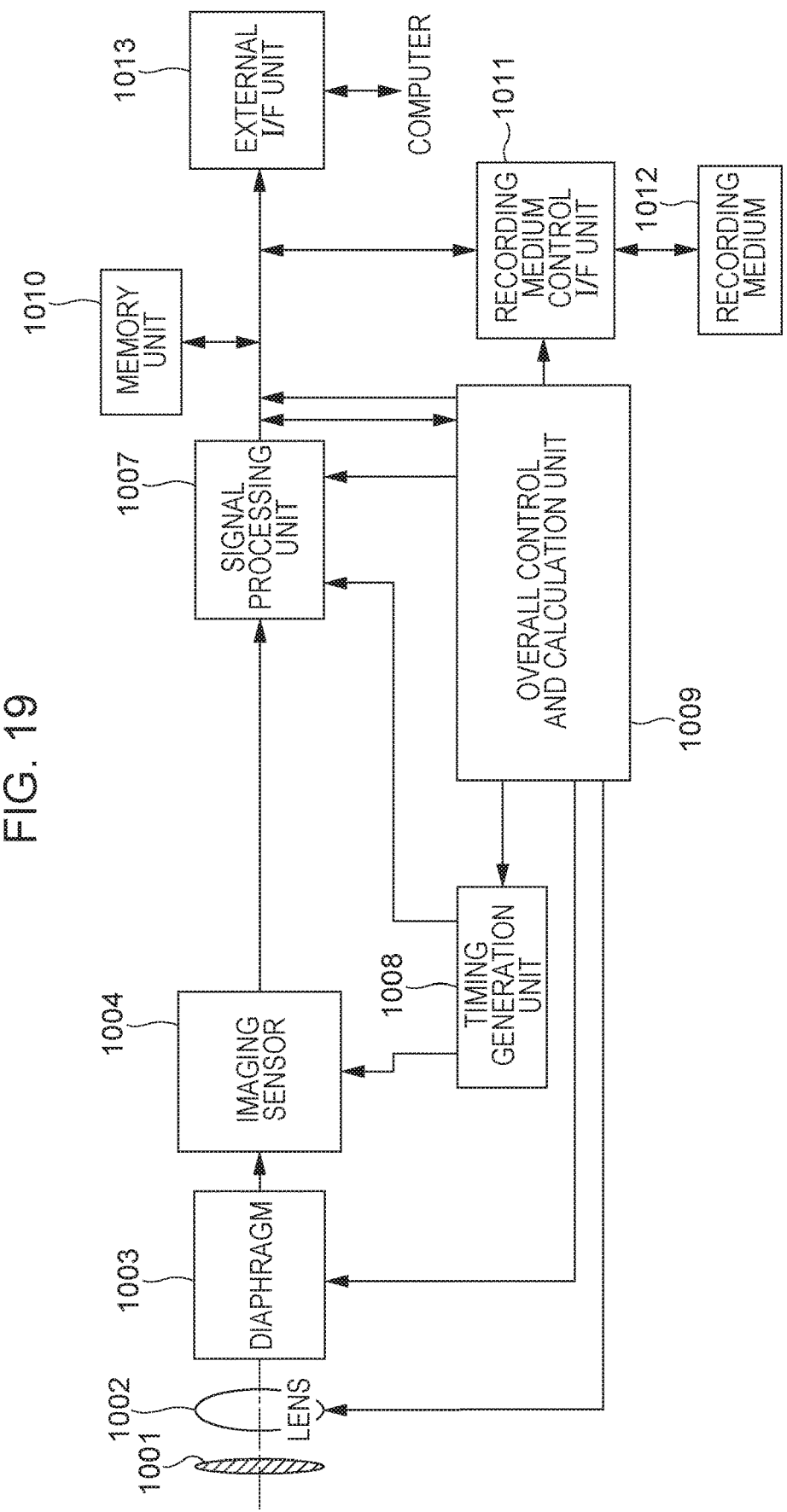
FIG. 19 is a block diagram of an imaging system according to an exemplary embodiment.

An imaging system according to an exemplary embodiment will be described. A digital still camera, a digital camcorder, a camera head, a copier, a facsimile device, a mobile phone, a smart phone, an on-vehicle camera, an observation satellite, and the like are exemplified as the imaging system. FIG. 19 is a block diagram of a digital still camera as an example of the imaging system.

FIG. 19 illustrates a lens protection barrier 1001 and a lens 1002 that focuses an optical image of the object on an imaging sensor 1004. A diaphragm 1003 can vary the amount of light that has passed through the lens 1002. The imaging sensor described according to any one of the first to fourth exemplary embodiments described above is used as the imaging sensor 1004.

A signal processing unit 1007 performs processing such as correction or data compression with respect to a pixel signal output from the imaging sensor 1004 and obtains an image signal. Then, in FIG. 19, a timing generation unit 1008 outputs various timing signals to the imaging sensor 1004 and the signal processing unit 1007, and an overall control unit 1009 controls the entirety of the digital still camera. A frame memory unit 1010 temporarily stores image data. An interface unit 1011 is used for performing recording and reading with respect to a recording medium. A recording medium 1012 is a detachably recording medium such as a semiconductor memory that performs recording and reading of the imaging data. An interface unit 1013 is used for performing a communication with an external computer or the like.

It should be noted that it is sufficient when the imaging system includes at least the imaging sensor 1004 and the signal processing unit 1007 that processes the pixel signal output from the imaging sensor 1004. In this case, the other configurations are arranged outside the system.

As described above, according to the exemplary embodiment of the imaging system, the imaging sensor according to any one of the first to fourth exemplary embodiments is used as the imaging sensor 1004. According to the above-described configuration, it is possible to improve the sensitivity of the imaging system.

Seventh Exemplary Embodiment

A moving body according to an exemplary embodiment will be described. The moving body according to the present exemplary embodiment is an automobile provided with an on-vehicle camera. FIG. 20A schematically illustrates an exterior appearance of an automobile 2100 and a main internal structure. The automobile 2100 is provided with an imaging sensor 2102, an application specific integrated circuit (ASIC) 2103 for the imaging system, an alarm apparatus 2112, and a main control unit 2113.

The imaging sensor described according to the above-described respective exemplary embodiments is used as the imaging sensor 2102. When a signal indicating an abnormality is received from the imaging system, a vehicle sensor, a control unit, and the like, the alarm apparatus 2112 issues a warning to a driver. The main control unit 2113 controls operations of the imaging system, the vehicle sensor, the control unit, and the like in an overall manner. It should be noted that it is also sufficient even when the automobile 2100 is not provided with the main control unit 2113. In this case, the imaging system, the vehicle sensor, and the control unit individually include a communication interface and respectively perform transmission and reception of a control signal via the communication interface (CAN standard, for example).

Figure 20B:
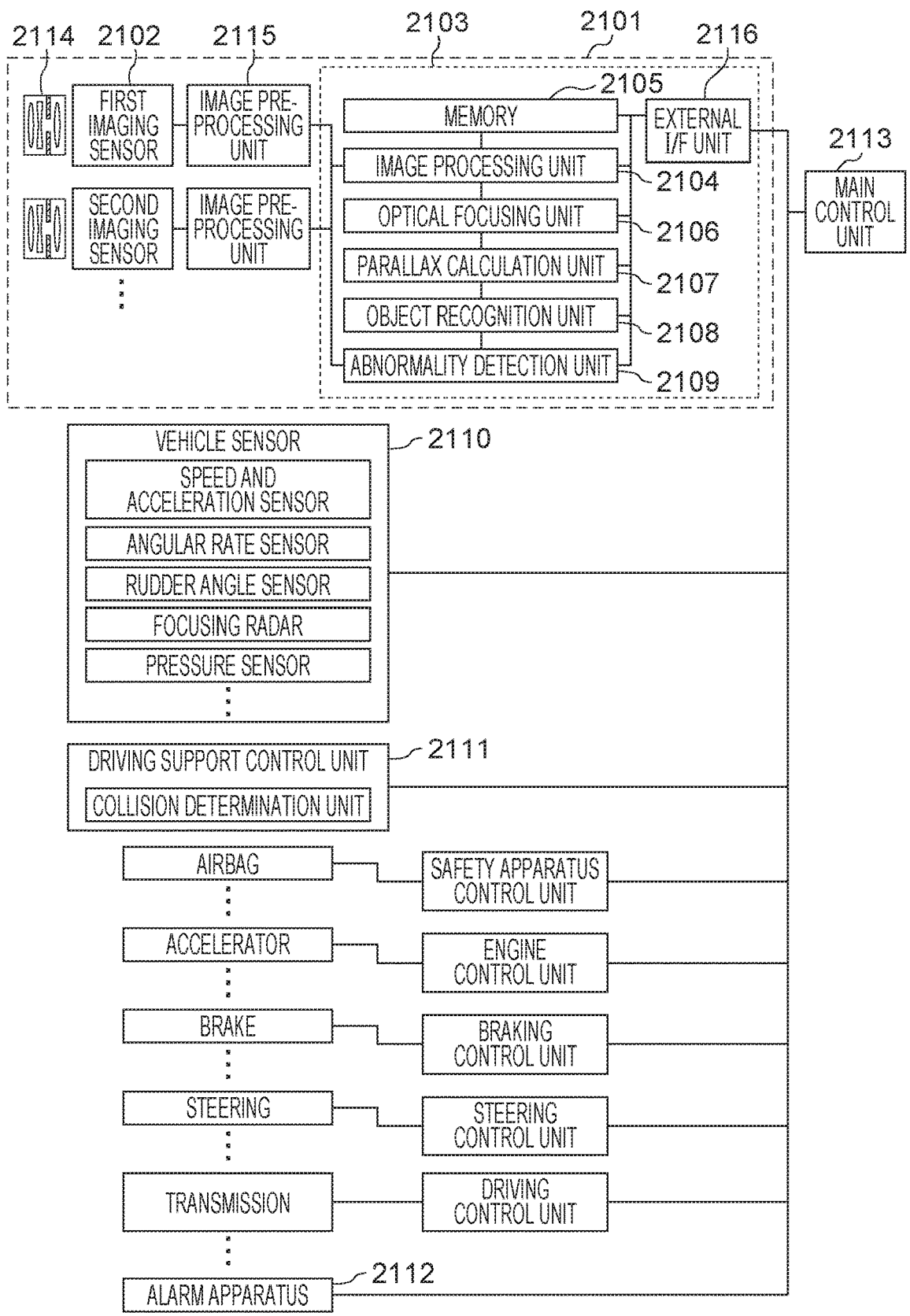

FIG. 20B is a block diagram illustrating a system configuration of the automobile 2100. The automobile 2100 includes a first imaging sensor 2102 and a second imaging sensor 2102. That is, the on-vehicle camera according to the present exemplary embodiment is a stereo camera. An object image is formed on the imaging sensor 2102 by an optical unit 2114. A pixel signal output from the imaging sensor 2102 is processed by an image pre-processing unit 2115 and then transmitted to an integration circuit 2103 for the imaging system. The image pre-processing unit 2115 performs processing such as S-N calculation or synchronous signal addition.

The integration circuit 2103 for the imaging system is provided with an image processing unit 2104, a memory 2105, an optical focusing unit 2106, a parallax calculation unit 2107, an object recognition unit 2108, an abnormality detection unit 2109, and an external interface (I/F) unit 2116. The image processing unit 2104 processes the pixel signal and generates an image signal. The image processing unit 2104 also performs correction of the image signal and complements an abnormal pixel. The memory 2105 temporarily stores the image signal. The memory 2105 may also store a position of the abnormal pixel of the imaging sensor 2102 which has been already found. The optical focusing unit 2106 performs focusing or ranging of the object by using the image signal. The parallax calculation unit 2107 performs object correlation (stereo matching) of a parallax image. The object recognition unit 2108 analyzes the image signal and recognizes an object such as an automobile, a person, a road sign, or a road. The abnormality detection unit 2109 detects a failure or a malfunction of the imaging sensor 2102. In a case where the failure or the malfunction is detected, the abnormality detection unit 2109 transmits a signal indicating that the abnormality has been detected to the main control unit 2113. The external I/F unit 2116 serve as an intermediary for transmission and reception of the information between the respective units of the integration circuit 2103 for the imaging system and the main control unit 2113, various control units, or the like.

The automobile 2100 includes a vehicle information obtaining unit 2110 and a driving support unit 2111. The vehicle information obtaining unit 2110 includes vehicle sensors such as a speed and acceleration sensor, an angular rate sensor, a rudder angle sensor, a focusing radar, and a pressure sensor.

The driving support unit 2111 includes a collision determination unit. The collision determination unit determines whether or not there is a possibility that a collision to an object occurs on the basis of information from the optical focusing unit 2106, the parallax calculation unit 2107, and the object recognition unit 2108. The optical focusing unit 2106 and the parallax calculation unit 2107 are examples of a distance information obtaining unit configured to obtain distance information to a target object. That is, the distance information is information related to parallax, a defocus amount, a distance to the target object, and the like. The collision determination unit may determine the collision possibility by using one of these pieces of distance information. The distance information obtaining unit may be realized by dedicatedly designed hardware or a software module.

The example has been described in which the driving support unit 2111 controls the automobile 2100 so as to avoid the collision with the other object, but the present exemplary embodiment can also be applied to control for following the other vehicle to perform automated driving, control for the automated driving without drifting from a lane, or the like.

The automobile 2100 is further provided with driving units such as an air bag, an accelerator, a brake, a steering, and a transmission used for travelling. The automobile 2100 also includes those control units. The control units control corresponding driving units on the basis of control signals of the main control unit 2113.

The imaging system used according to the present exemplary embodiment can be applied to not only the automobile but also a moving body (moving apparatus) such as, for example, a vessel, aircraft, or industrial robot. In addition, the imaging system can be widely applied to not only the moving body but also a device using object recognition such as an intelligent transport system (ITS).

As described above, in the automobile according to the exemplary embodiment, the imaging sensor according to any one of the exemplary embodiments is used as the imaging sensor 2102. According to the above-described configuration, it is possible to improve the sensitivity of the imaging sensor in the moving body provided with the imaging sensor.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-127980, filed Jun. 29, 2017, which is hereby incorporated by reference herein in its entirety.

What is claimed is:

1. An imaging sensor which has a plurality of pixels, comprising:
   a first semiconductor substrate provided with a plurality of photoelectric conversion units;
   a second semiconductor substrate; and
   a plurality of lines that are arranged between the first semiconductor substrate and the second semiconductor substrate,
   wherein at least one pixel of the plurality of pixels includes:
      a photoelectric conversion unit of the plurality of photoelectric conversion units;
      first and second transfer units arranged on the first semiconductor substrate, the first and second transfer units being configured to transfer charges generated in the photoelectric conversion unit or signals based on the charges; and
      first and second signal holding units, wherein a first line of the plurality of lines connects the first transfer unit to of the first signal holding unit, and a second line of the plurality of lines connects the second transfer unit to the second signal holding unit, and wherein the first signal holding unit and the second signal holding unit are connected to a floating diffusion portion in common.

2. The imaging sensor according to claim 1,
wherein each of the first and second transfer units includes a transfer gate electrode and a semiconductor region, and
wherein the first line is connected to the semiconductor region of the first transfer unit, and the second line is connected to the semiconductor region of the second transfer unit,
wherein the floating diffusion portion is arranged on the second semiconductor substrate.

3. The imaging sensor according to claim 1, further comprising:
a light shielding portion arranged between the photoelectric conversion unit and at least a part of the first and second signal holding units, the light shielding portion being configured to shield light that has passed through the first semiconductor substrate.

4. The imaging sensor according to claim 3, wherein at least a part of the light shielding portion is constituted by at least one of the first and second lines.

5. The imaging sensor according to claim 1, wherein the light shielding portion includes a second light shielding portion.

6. The imaging sensor according to claim 1, further comprising:
a metallic member arranged between the photoelectric conversion unit and at least a part of the first and second signal holding units,
wherein the metallic member is overlapped with the photoelectric conversion unit in a plan view with respect to the first semiconductor substrate.

7. The imaging sensor according to claim 6, wherein the metallic member constitutes at least one of the first and second lines.

8. The imaging sensor according to claim 1, wherein each of the first and second signal holding units includes a semiconductor region arranged on the second semiconductor substrate.

9. The imaging sensor according to claim 1, wherein each of the first and second signal holding units includes a pair of electrodes arranged between the first semiconductor substrate and the second semiconductor substrate.

10. A system comprising:
the imaging sensor according to claim 1; and
a processing unit configured to process a signal output from the imaging sensor.

11. An apparatus comprising:
the imaging sensor according to claim 1;
a processing unit configured to process a signal output from the imaging sensor; and
a control unit configured to control a driving unit based on a result of the processing.

12. The imaging sensor according to claim 1, wherein the one pixel includes:
a first transfer transistor connecting the first signal holding unit to the floating diffusion portion; and
a second transfer transistor connecting the second signal holding unit to the floating diffusion portion.

13. The imaging sensor according to claim 12, further comprising an amplification transistor arranged on the second semiconductor substrate, wherein the first signal holding unit is connected to the amplification transistor via the first transfer transistor, and the second signal holding unit is connected to the amplification transistor via the second transfer transistor.

14. The imaging sensor according to claim 1, wherein the one pixel includes:
a third transfer unit arranged on the first semiconductor substrate, the third transfer unit being configured to transfer charges generated in the photoelectric conversion unit or signals based on the charges; and
a third signal holding unit,
wherein a third line of the plurality of lines connects the third transfer unit to the third signal holding unit.

15. The imaging sensor according to claim 1, wherein another pixel of the plurality of pixels includes:
another photoelectric conversion unit of the plurality of photoelectric conversion units;
third and fourth transfer units arranged on the first semiconductor substrate, the third and fourth transfer units being configured to transfer charges generated in the another photoelectric conversion unit or signals based on the charges; and
third and fourth signal holding units,
wherein a third line of the plurality of lines connects the third transfer unit to the third signal holding unit, and a fourth line of the plurality of lines connects the fourth transfer unit to the fourth signal holding unit,
wherein the third signal holding unit and the fourth signal holding unit are connected to the floating diffusion portion in common.

16. The imaging sensor according to claim 1 wherein an axis of a transfer path of the first transfer unit and an axis of a transfer path of the second transfer unit are mutually offset, or a direction of a transfer path of the first transfer unit and a direction of a transfer path of the second transfer unit are intersect with each other.

17. An imaging sensor which has a plurality of pixels, comprising:
a first semiconductor substrate provided with a plurality of photoelectric conversion units;
a second semiconductor substrate; and
a plurality of lines that are arranged between the first semiconductor substrate and the second semiconductor substrate,
wherein at least one pixel of the plurality of pixels includes:
a photoelectric conversion unit of the plurality of photoelectric conversion units;
first and second transfer units arranged on the first semiconductor substrate, the first and second transfer units being configured to transfer charges generated in the photoelectric conversion unit or signals based on the charges; and
first and second signal holding units,
wherein a first line of the plurality of lines connects the first transfer unit to the first signal holding unit, and a second line of the plurality of lines connects the second transfer unit to the second signal holding unit,
wherein a light shielding portion is arranged between the photoelectric conversion unit and at least a part of the plurality of signal holding units and configured to shield light that has passed through the first semiconductor substrate, wherein the light shielding portion includes a first light shielding portion constituted by one of the plurality of lines, wherein the light shielding portion includes a second light shielding portion having an opening through which a line passes, and wherein the first light shielding portion is overlapped with the opening in a plan view with respect to the first semiconductor substrate.

18. An imaging sensor which has a plurality of pixels, comprising:

a first semiconductor substrate provided with a plurality of photoelectric conversion units; and a second semiconductor substrate, wherein at least one pixel of the plurality of pixels includes:

a photoelectric conversion unit of the plurality of photoelectric conversion units;

first and second transfer units configured to transfer charges generated in the photoelectric conversion unit or signals based on the charges, a charge discharging transistor arranged on the first semiconductor substrate, the charge discharging transistor being configured to discharge charges generated in the photoelectric conversion unit; and first and second signal holding units, wherein the first signal holding units is connected to the first transfer unit, and wherein the first signal holding unit is connected to a transistor arranged on the second semiconductor substrate.

19. The imaging sensor according to claim 18, wherein each of the first and second transfer units is connected to the photoelectric conversion unit and includes a transfer gate electrode and a semiconductor region where the charges are transferred, wherein the transistor to which the first signal holding unit is connected, is a first reset transistor, and wherein the second signal holding unit is connected to a second reset transistor arranged on the second semiconductor substrate.

20. The imaging sensor according to claim 18, further comprising:

a light shielding portion arranged between the photoelectric conversion unit and at least a part of the first and second signal holding units and configured to shield light that has passed through the first semiconductor substrate.

21. The imaging sensor according to claim 18, further comprising:

a metallic member arranged between the photoelectric conversion unit and at least a part of the first and second signal holding units, wherein the metallic member is overlapped with the photoelectric conversion unit in a plan view with respect to the first semiconductor substrate.

22. The imaging sensor according to claim 18, wherein each of the first and second signal holding units includes a semiconductor region arranged on the second semiconductor substrate.

23. A system comprising:

the imaging sensor according to claim 18; and a processing unit configured to process a signal output from the imaging sensor.

24. An apparatus comprising:

the imaging sensor according to claim 18;

a processing unit configured to process a signal output from the imaging sensor; and a control unit configured to control a driving unit based on a result of the processing.

25. The imaging sensor according to claim 18, wherein the one pixel includes:

a first transfer transistor arranged on the second semiconductor substrate and connected to the first signal holding unit; and a second transfer transistor arranged on the second semiconductor substrate and connected to the second signal holding unit.

* * * * *